(12) United States Patent
Franke

(10) Patent No.: US 11,181,394 B2
(45) Date of Patent: Nov. 23, 2021

(54) DISTANCE MEASURING DEVICE

(71) Applicant: TDK-Micronas GmbH, Freiburg (DE)

(72) Inventor: Joerg Franke, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 102 days.

(21) Appl. No.: 16/173,509

(22) Filed: Oct. 29, 2018

(65) Prior Publication Data

US 2019/0063953 A1 Feb. 28, 2019

Related U.S. Application Data

(63) Continuation of application No. PCT/EP2016/000693, filed on Apr. 29, 2016.

(51) Int. Cl.
*G01R 33/06* (2006.01)
*G01D 5/14* (2006.01)
*G01B 7/14* (2006.01)

(52) U.S. Cl.
CPC ............... *G01D 5/147* (2013.01); *G01B 7/14* (2013.01); *G01R 33/06* (2013.01)

(58) Field of Classification Search
CPC .......... G01D 5/14; G01D 5/142; G01D 5/145; G01D 5/147; G01R 33/06; G01R 33/07;
(Continued)

(56) References Cited

U.S. PATENT DOCUMENTS 5,412,317 A 5/1995 Kyoizumi
6,043,646 A 3/2000 Jansseune
(Continued)

FOREIGN PATENT DOCUMENTS

CN 101275992 A 10/2008
CN 103282745 A 9/2013
(Continued)

OTHER PUBLICATIONS

International Search Report dated Feb. 3, 2017 in corresponding application PCT/EP2016/000693.
(Continued)

*Primary Examiner* — Jermele M Hollington
*Assistant Examiner* — Taqi R Nasir
(74) *Attorney, Agent, or Firm* — Muncy, Geissler, Olds & Lowe, P.C.

(57) ABSTRACT

A distance measuring device with two magnetic field sensors and a permanent magnet and a semiconductor body is provided. The device includes a monolithically integrated evaluation circuit, and a difference signal can be determined by means of the magnetic field sensors and provides an output signal as a result of the determination. The value of the output signal based on the neutralization of a magnetic-flux-free region is a function of a distance of a ferromagnetic sensing element from the two magnetic field sensors. The semiconductor body is arranged between U-shaped pole shanks of the magnet, which is magnetized in the X direction, wherein the first magnetic field sensor is arranged in an area located between two opposing shanks of the first pole, and the second magnetic field sensor is arranged in an area located between two opposing shanks of the second pole.

20 Claims, 17 Drawing Sheets

(58) Field of Classification Search
CPC .... G01R 33/072; G01R 33/077; G01R 33/09; G01R 33/091; G01R 33/093; G01R 33/095; G01R 33/096; G01R 33/098; G01R 33/00; G01R 33/0035; G01R 33/0023; G01R 33/0017; G01R 31/3191; H03K 17/95; H03K 17/9517; G01B 7/14; G01B 7/004; G01C 17/38; G06F 3/017; G06F 3/0346; G06F 3/012

See application file for complete search history.

(56) References Cited

U.S. PATENT DOCUMENTS

| | | | |
|---|---|---|---|
| 6,323,642 B1 * | 11/2001 | Nishimura | H01L 23/49816 324/207.2 |
| 7,746,064 B2 | 6/2010 | Knorr et al. | |
| 7,759,931 B2 | 7/2010 | Tsukada et al. | |
| 9,429,632 B2 | 8/2016 | Kawano et al. | |
| 9,562,954 B2 | 2/2017 | Ausserlechner et al. | |
| 9,645,203 B2 | 5/2017 | Kaufmann et al. | |
| 9,880,024 B2 | 1/2018 | Kaufmann et al. | |
| 2004/0036467 A1 | 2/2004 | May et al. | |
| 2007/0013367 A1 * | 1/2007 | Murata | G01R 33/093 324/207.21 |
| 2009/0295374 A1 * | 12/2009 | Okazaki | G01R 33/07 324/207.2 |
| 2011/0238367 A1 | 9/2011 | Matsumoto et al. | |
| 2011/0267040 A1 * | 11/2011 | Frachon | G01D 5/147 324/207.2 |
| 2013/0264915 A1 | 10/2013 | Suzuki et al. | |
| 2014/0333298 A1 * | 11/2014 | Heberle | G01R 33/0017 324/228 |
| 2015/0260547 A1 | 9/2015 | Kaufmann et al. | |
| 2016/0146633 A1 * | 5/2016 | Ueno | G01D 5/145 324/207.25 |
| 2017/0102250 A1 | 4/2017 | Franke | |

FOREIGN PATENT DOCUMENTS

| | | |
|---|---|---|
| CN | 105319518 A | 2/2016 |
| CN | 105372605 A | 3/2016 |
| DE | 19941860 A1 | 3/2001 |
| DE | 102004046824 A1 | 4/2006 |
| DE | 102011006131 A1 | 9/2011 |
| DE | 102014003408 A1 | 9/2015 |
| DE | 102015013022 A1 | 4/2017 |
| EP | 1 477 772 A1 | 11/2004 |
| GN | 104246445 A | 12/2014 |
| JP | H 06-026884 A | 2/1994 |
| JP | H 08-330396 A | 12/1996 |
| JP | H 09511357 A | 11/1997 |
| WO | WO 2006/109382 A1 | 10/2006 |

OTHER PUBLICATIONS

Chinese Search Report dated Jun. 24, 2020 in corresponding application 201680085061.

* cited by examiner

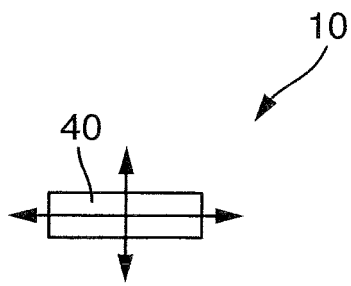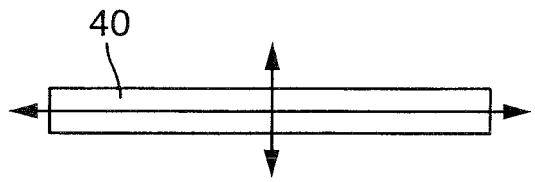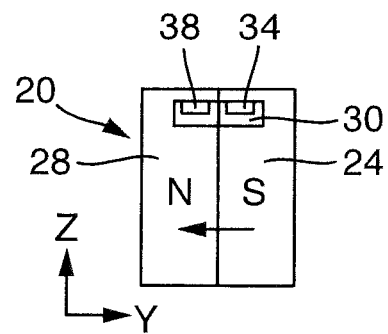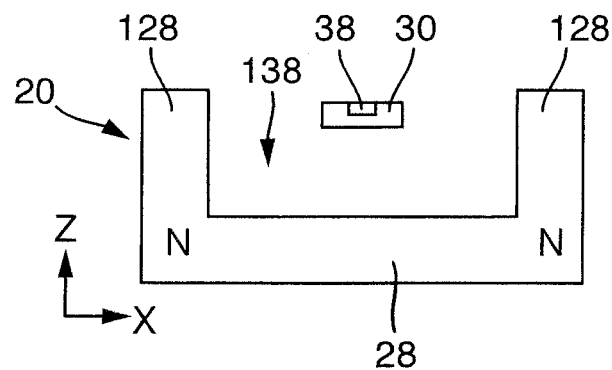
Fig. 1a
Fig. 1b
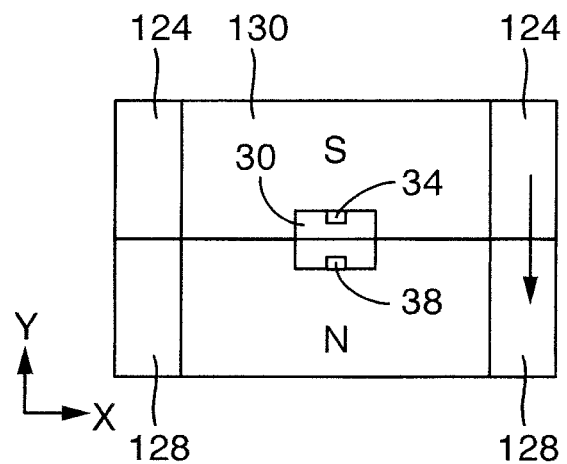
Fig. 1c

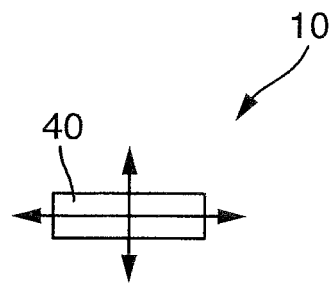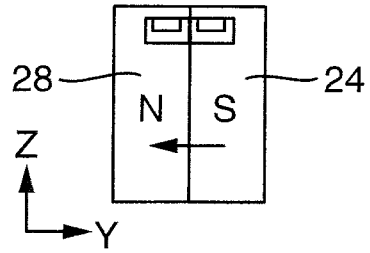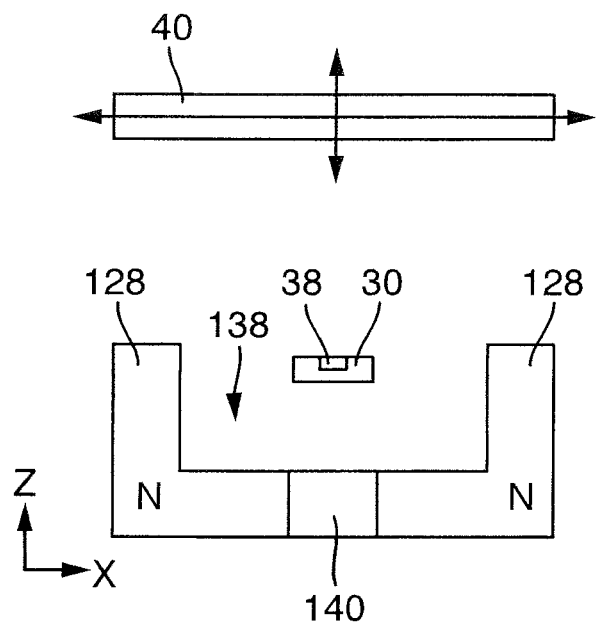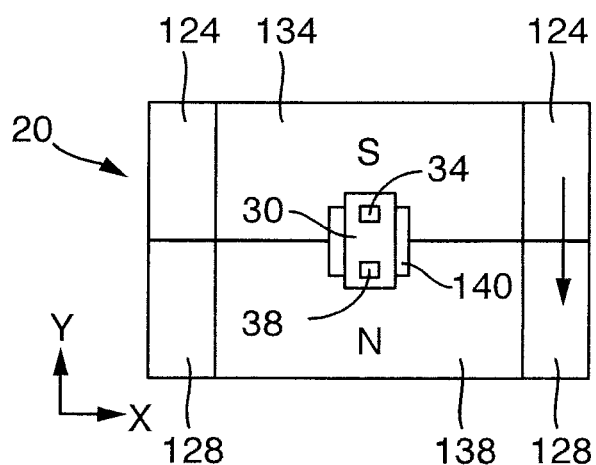
Fig. 2a
Fig. 2b
Fig. 2c

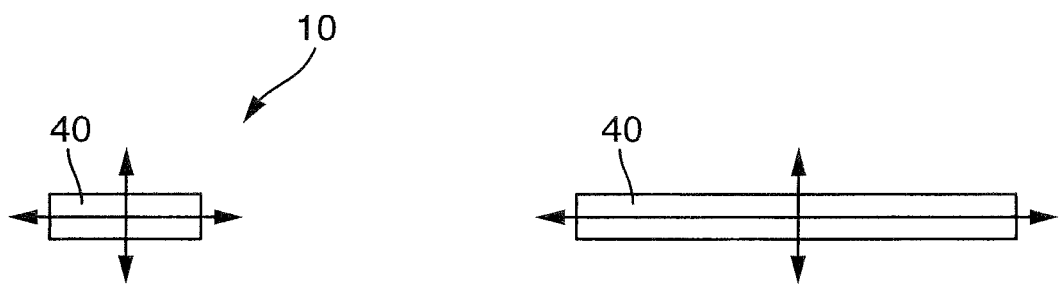
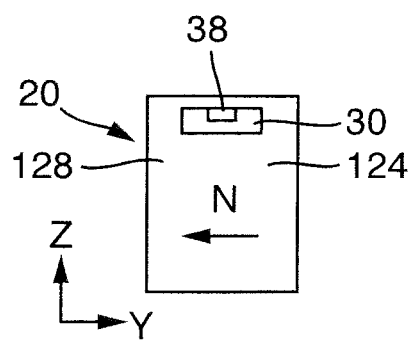
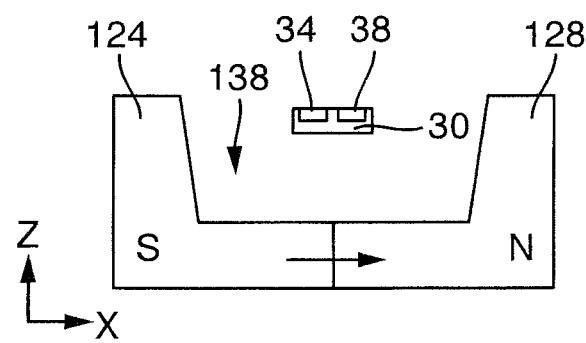
Fig. 3a
Fig. 3b
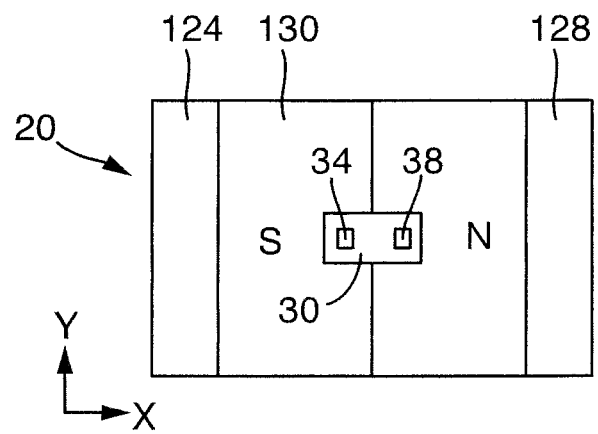
Fig. 3c

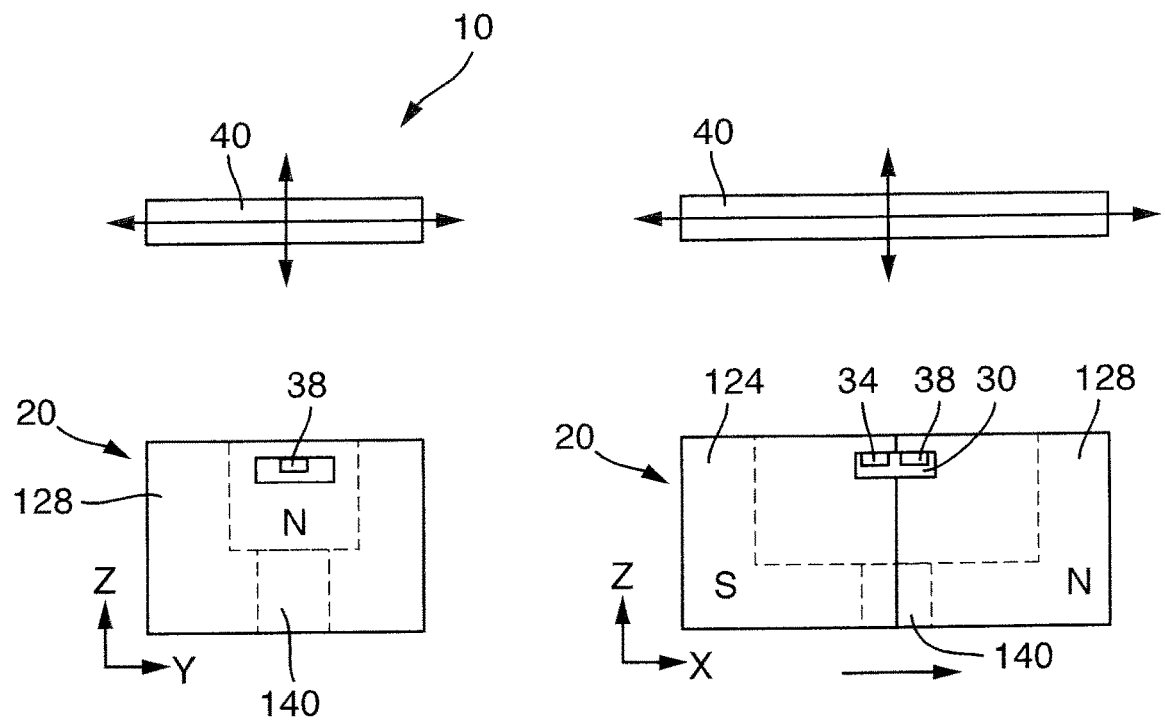
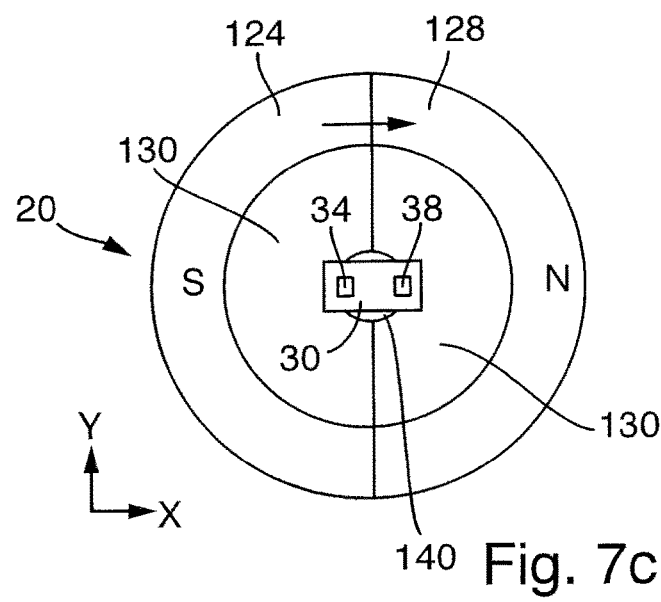
Fig. 7a  Fig. 7b  Fig. 7c

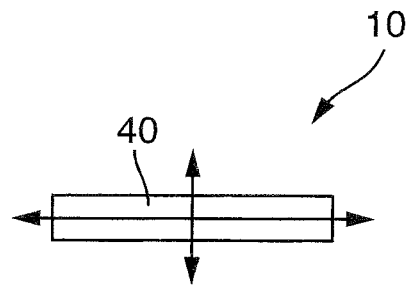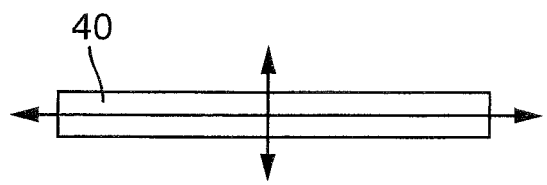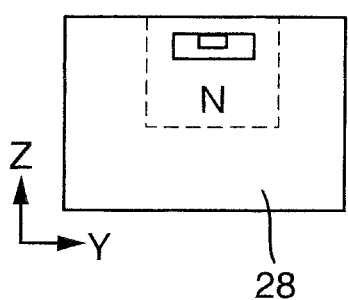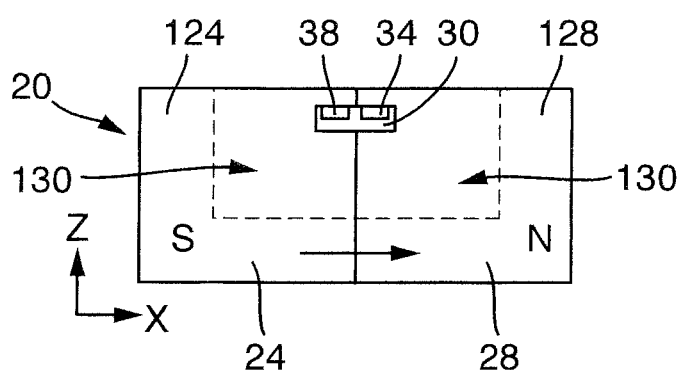
Fig. 8a
Fig. 8b
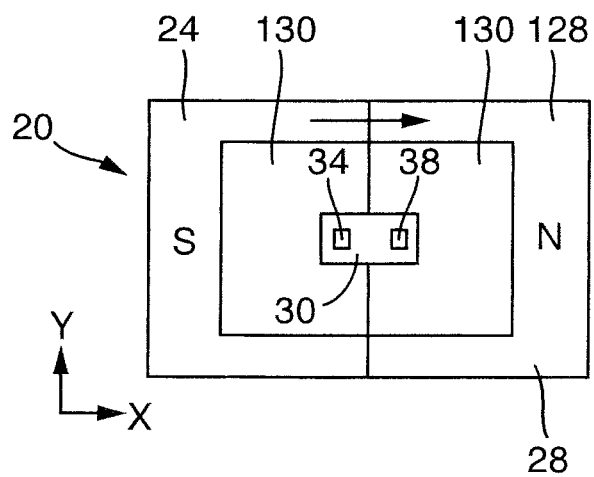
Fig. 8c

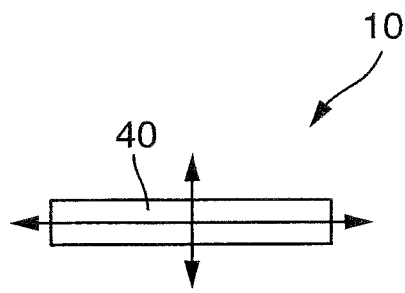
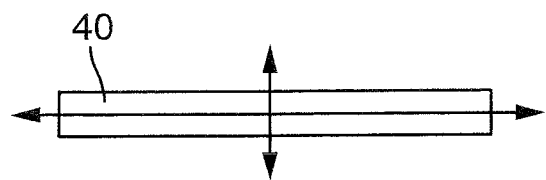
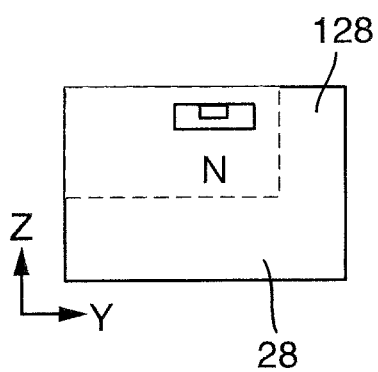
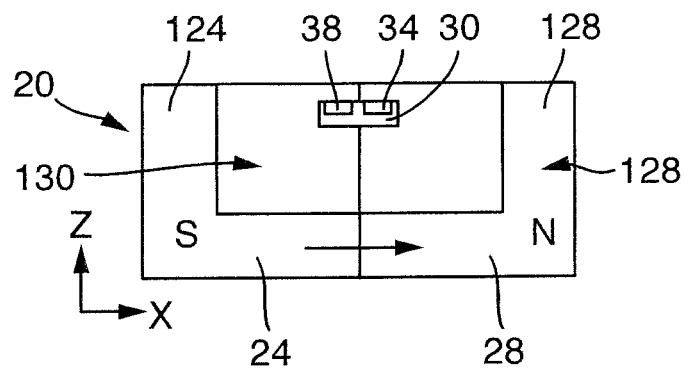
Fig. 9a
Fig. 9b
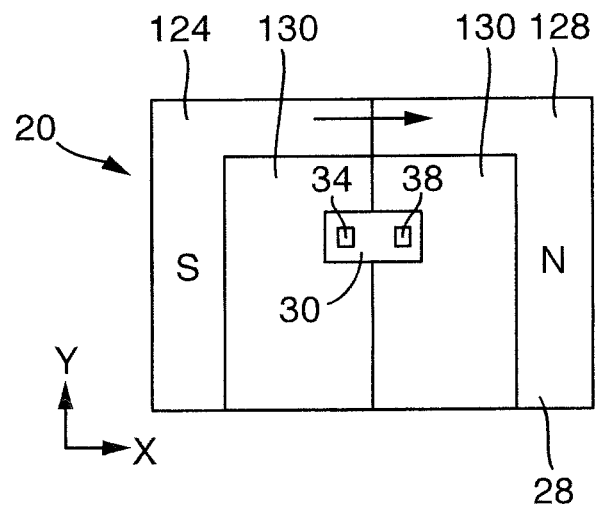
Fig. 9c

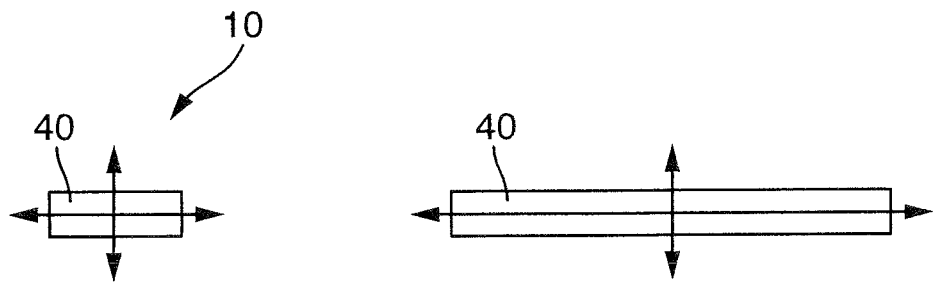
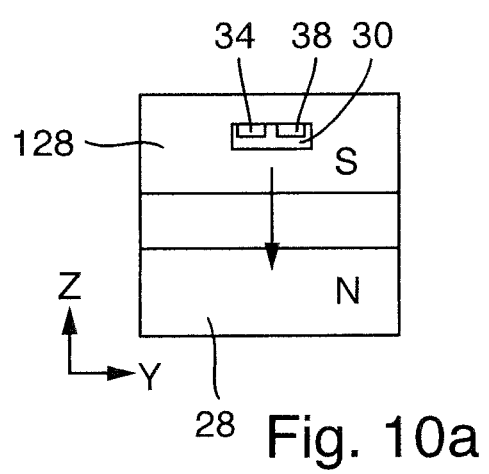
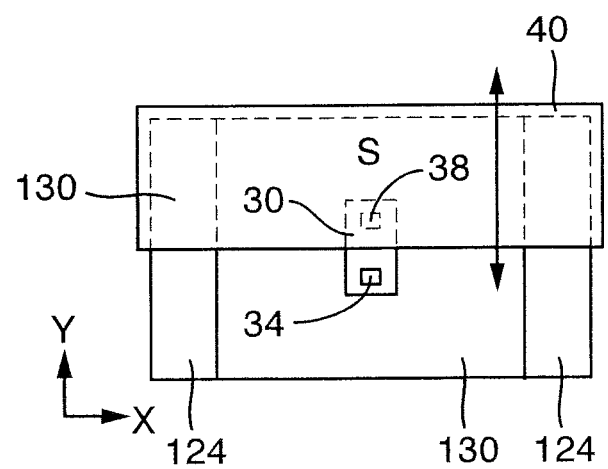
Fig. 10a
Fig. 10b
Fig. 10c

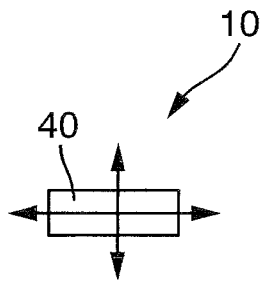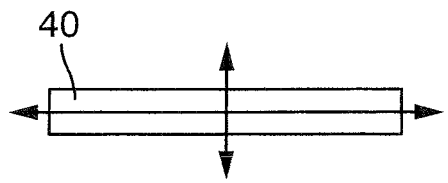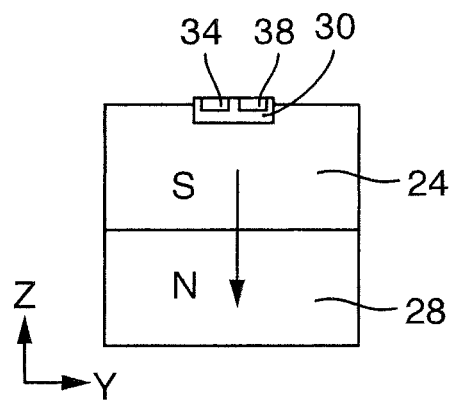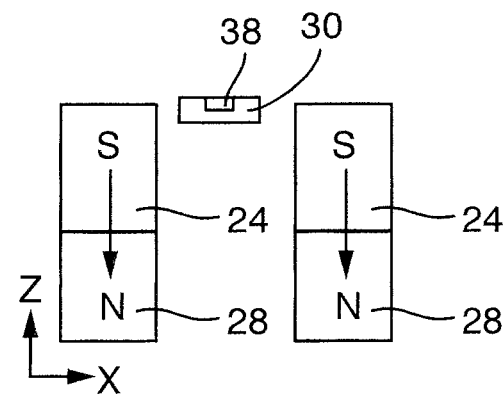
Fig. 13a  Fig. 13b
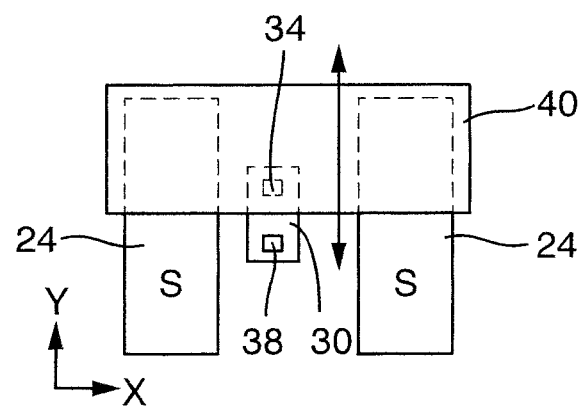
Fig. 13c

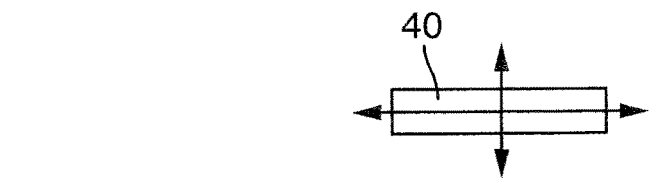
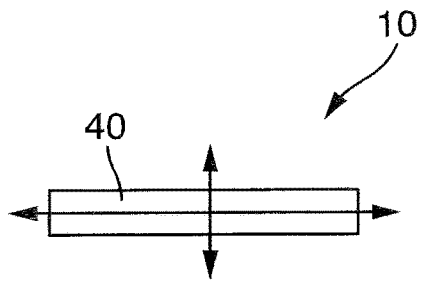
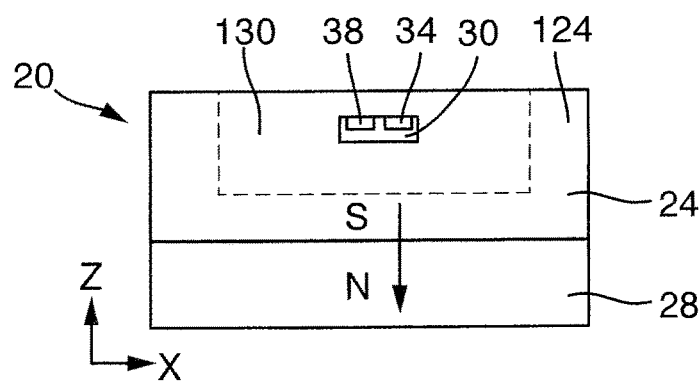
Fig. 16a
Fig. 16b
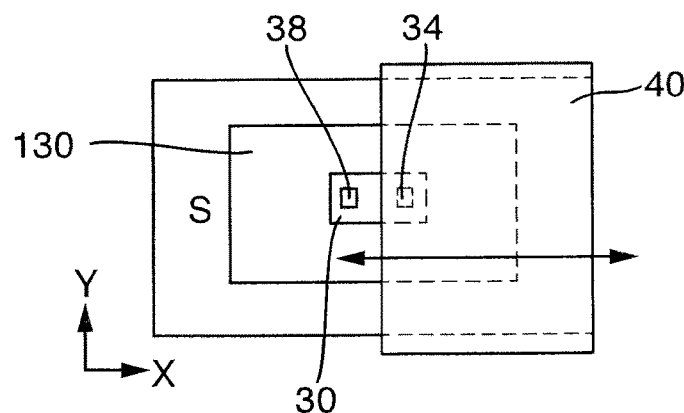
Fig. 16c

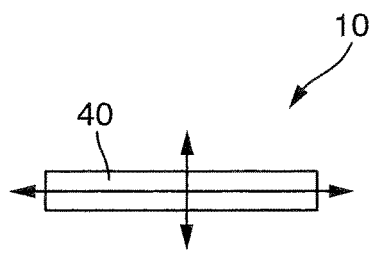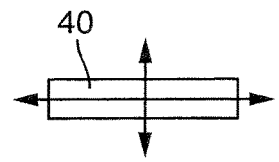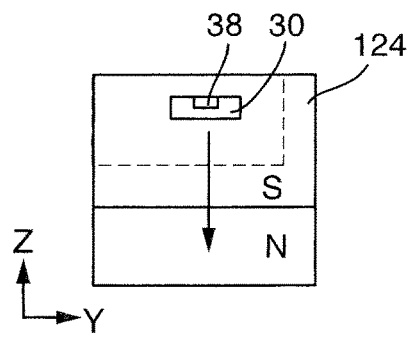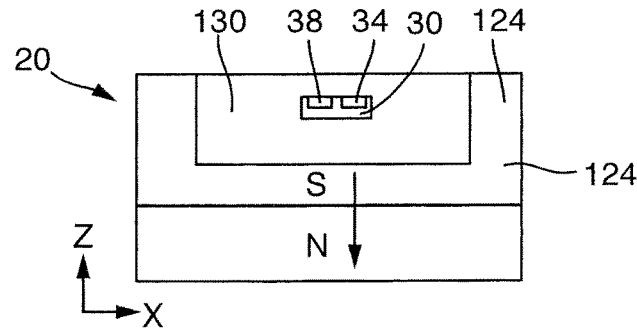
Fig. 17a　　　　　　　　Fig. 17b
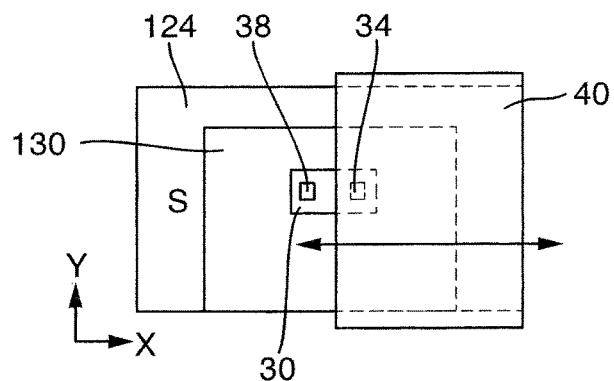
Fig. 17c

DISTANCE MEASURING DEVICE

This nonprovisional application is a continuation of International Application No. PCT/EP2016/000693, which was filed on Apr. 29, 2016, and which is herein incorporated by reference.

BACKGROUND OF THE INVENTION

Field of the Invention

The present invention relates to a distance measuring device.

Description of the Background Art

A magnetic field measuring device is known from DE 10 2015 013 022 A1, which corresponds to US 20170102250, and which is incorporated herein by reference.

SUMMARY OF THE INVENTION

It is therefore an object of the present invention to provide a device that advances the state of the art.

In an exemplary embodiment of the invention, a distance measuring device is provided, wherein the distance measuring device has a first magnetic field sensor, wherein the magnetic field sensor provides a first measurement signal as a function of the strength of the magnetic field, and the distance measuring device has at least one permanent magnet.

The permanent magnet has a first magnetic pole with a first pole face, and a second magnetic pole with a second pole face.

Also provided is a semiconductor body with a monolithically integrated analysis circuit, wherein the analysis circuit is in operative electrical connection with the first magnetic field sensor, and the semiconductor body has a surface formed in the X-Y plane.

In addition, a second magnetic field sensor based on the same physical operating principle (for example the same type, such as hall sensors) as the first magnetic field sensor is provided, wherein the second magnetic field sensor makes available a second measurement signal as a function of the strength of the magnetic field, and the second magnetic field sensor is in operative connection with the analysis circuit.

The analysis circuit determines a difference signal for suppression of DC magnetic fields and provides an output signal as the result of the determination, wherein the value of the output signal based on the neutralization of a magnetic-flux-free region is a function of a distance of a ferromagnetic encoding element from the two magnetic field sensors.

The two magnetic field sensors are frictionally attached to the surface of the semiconductor body and are arranged substantially identically or exactly identically in order to measure the same component of the magnetic field.

In a first embodiment, in order to measure the magnitude of the flux change in the case of a first encoding element acting with equal strength on the two semiconductor sensors, the semiconductor body is arranged between U-shaped pole shanks of the magnet, which is magnetized in the X direction.

In this design, the first magnetic field sensor is arranged in an area located between two opposing shanks of the first pole, while the second magnetic field sensor is arranged in an area located between two opposing shanks of the second pole.

A floor area is formed between the pole shanks, and the semiconductor body is arranged above the floor region in the Z direction.

In a second embodiment, in order to measure the magnitude of the flux change in the case of a second encoding element acting with different strengths on the two semiconductor sensors, the permanent magnet is magnetized in the Z direction.

One of the two pole faces is formed in the X-Y plane and the magnetic field sensors are arranged along the at least one pole face.

It is a matter of course that the first pole of the permanent magnet can be implemented as the north pole and the second pole as the south pole or vice versa. Although it is preferred for the permanent magnet to be implemented as a single piece, two individual or multiple individual permanent magnets may also be used advantageously in some of the improvements that follow.

It should be noted that, in the first embodiment, the expression "encoding element acting with equal strength" can be understood to mean a so-called symmetrical encoding element. For example, such encoding elements are plate-shaped in design, with the size of the plate being larger, in particular, than the distance between the two magnetic field sensors. The encoding element has an equal distance from the two magnetic field sensors, i.e. when there is a change in the distance, the changes to the two magnetic field sensors take place uniformly.

In the second embodiment, the expression "encoding element acting with different strengths" can be understood to mean a so-called asymmetrical encoding element. Here, the distance from the encoding element to the two magnetic field sensors is always different.

It should also be noted that for both embodiments of the semiconductor bodies, the two magnetic field sensors can be arranged with respect to one of the poles or to both poles such that the sensors see no magnetic field in the absence of an encoding element, which is to say they generate no measurement signal. In other words, the two magnetic field sensors are positioned such that the particular components of the magnetic field to which the two magnetic field sensors are sensitive are essentially nearly zero or preferably are so small that the components are not detectable for the magnetic field sensors. In other words, the two magnetic field sensors can be arranged specifically in a region that is free of magnetic flux. When a ferromagnetic encoding element approaches, the measurement signal and the output signal are then based ultimately on the neutralization of the magnetic-flux-free region, at least of the one measurable component of the magnetic field.

It is a matter of course that, in a case when so-called 3D magnetic field sensors are used, which sense all three components of the magnetic field, the magnetic-flux-free region relates to all three components.

An advantage of the device according to the invention is that DC magnetic fields can be rejected by means of the determination of the difference signal through the arrangement of two magnetic field sensors. Furthermore, the signal excursion increases, and the reliability of the distance determination is improved.

The permanent magnet can be U-shaped in design and has two opposing straight and parallel shanks or circular shanks. In the first embodiment here, the polarity of the magnetic field alternates in the direction perpendicular to the Z axis, whereas in the second embodiment the floor region of the magnet as a whole has a different polarity from the entire shank region.

The permanent magnet can have a recess in a central region. For example, the recess can be designed in the form of a hole, wherein the recess in the form of a hole is designed to be circular as well as quadrilateral, preferably rectangular. Investigations have shown that the zero field region can be enlarged by means of the recess. For example, the central region with the recess can include the geometric center of the permanent magnet.

The semiconductor body and be located above the geometric center of the permanent magnet, so that the normal formed at the location of the geometric center of the permanent magnet passes through the semiconductor body.

The permanent magnet in the first alternative can have two opposing vertically magnetized single magnets arranged directly adjacent to one another. The permanent magnet is now implemented in two pieces instead of a single piece as before.

A floor region can be formed between the shanks, wherein the polarity of the magnet switches along the center line in the region of the floor in the case of the first alternative, and in the case of the second alternative the polarity in the region of the floor of the magnet remains the same.

The shanks can form an enclosing wall in the X-Y plane. In the case of the first alternative, a first half of the wall has the first magnetic polarity and a second half of the wall has the second polarity. In this design, the first magnetic field sensor is located in the region of the first magnetic polarity and the second magnetic field sensor is located in the region of the second magnetic polarity. In the case of the second alternative the enclosing wall has a uniform magnetic polarity, i.e., both magnetic field sensors are located in the region of either the first polarity or the second polarity.

The surfaces of the two magnetic field sensors located in the X-Y plane can have an equal or shorter distance from the inner floor area of the magnet with regard to the Z direction than the pole faces formed at the ends of the shanks. In other words, the surface of the magnetic field sensors is at most at the same height as, but by preference is somewhat lower than, the pole faces.

The two magnetic field sensors can have the same distance from the applicable immediately adjacent pole face, i.e., the distance is equal in the X direction and/or in the Y direction from the applicable immediately adjacent pole faces.

In an example, in the case of the second alternative the two magnetic field sensors can be spaced apart in the X direction from the single pole face formed along the Y direction.

In an example, in the case of the second alternative the two magnetic field sensors can be arranged along the X direction and are arranged between the two permanent magnets that are spaced apart from one another in the X direction.

The two magnetic field sensors can each be implemented as Hall sensors and can be monolithically formed in the semiconductor body. Also, the Hall sensors can be designed as Hall plates implemented in the X-Y plane.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1a is a top view of an embodiment according to the invention in a view in the Y-Z plane, FIG. 1b is a top view of the embodiment according to the invention in a view in the X-Z plane, FIG. 1c is a top view of the embodiment according to the invention in a view in the X-Y plane, FIG. 2a is a top view of an embodiment according to the invention in a view in the Y-Z plane, FIG. 2b is a top view of the embodiment according to the invention in a view in the X-Z plane, FIG. 2c is a top view of the embodiment according to the invention in a view in the X-Y plane, FIG. 3a is a top view of an embodiment according to the invention in a view in the Y-Z plane, FIG. 3b is a top view of the embodiment according to the invention in a view in the X-Z plane, FIG. 3c is a top view of the embodiment according to the invention in a view in the X-Y plane, FIG. 7a is a top view of an embodiment according to the invention in a view in the Y-Z plane, FIG. 7b is a top view of the embodiment according to the invention in a view in the X-Z plane, FIG. 7c is a top view of the embodiment according to the invention in a view in the X-Y plane, FIG. 8a is a top view of an embodiment according to the invention in a view in the Y-Z plane, FIG. 8b is a top view of the embodiment according to the invention in a view in the X-Z plane, FIG. 8c is a top view of the embodiment according to the invention in a view in the X-Y plane, FIG. 9a is a top view of an embodiment according to the invention in a view in the Y-Z plane, FIG. 9b is a top view of the embodiment according to the invention in a view in the X-Z plane, FIG. 9c is a top view of the embodiment according to the invention in a view in the X-Y plane, FIG. 10a is a top view of an embodiment according to the invention in a view in the Y-Z plane, FIG. 10b is a top view of the embodiment according to the invention in a view in the X-Z plane, FIG. 10c is a top view of the embodiment according to the invention in a view in the X-Y plane, FIG. 13a is a top view of an embodiment according to the invention in a view in the Y-Z plane, FIG. 13b is a top view of the embodiment according to the invention in a view in the X-Z plane, FIG. 13c is a top view of the embodiment according to the invention in a view in the X-Y plane, FIG. 16a is a top view of an embodiment according to the invention in a view in the Y-Z plane, FIG. 16b is a top view of the embodiment according to the invention in a view in the X-Z plane, FIG. 16c is a top view of the embodiment according to the invention in a view in the X-Y plane, FIG. 17a is a top view of an embodiment according to the invention in a view in the Y-Z plane, FIG. 17b is a top view of the seventeenth embodiment according to the invention in a view in the X-Z plane, and FIG. 17c is a top view of the embodiment according to the invention in a view in the X-Y plane.

DETAILED DESCRIPTION

Figure 4A:
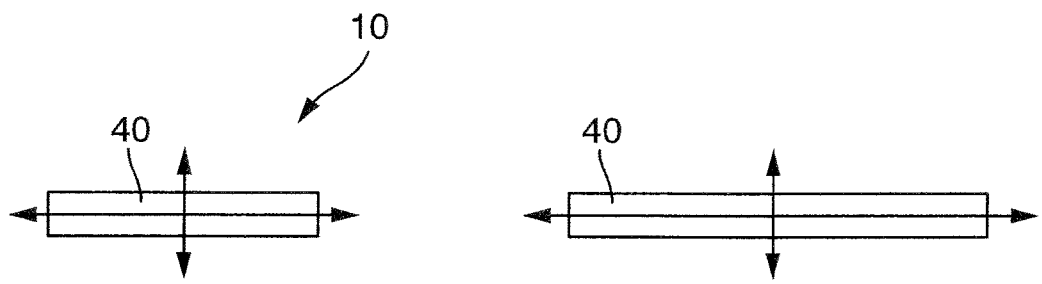
FIG. 4a is a top view of an embodiment according to the invention in a view in the Y-Z plane.

The following remark applies to all embodiments below: for purposes of illustration, only one selected direction of magnetization is shown in each case. However, it is a matter of course that the direction of magnetization in all exemplary embodiments shown can also be implemented at exactly 180°, which is to say opposite to the direction shown in each case, while maintaining the rest of the geometric arrangement and, in particular, the orientation of the semiconductor body with the two magnetic field sensors on the surface.

The illustration in FIG. 1a shows a top view of a first embodiment according to the invention of a distance measuring device 10 in a view in the Y-Z plane. The distance measuring device 10 includes a permanent magnet 20 with a direction of magnetization opposite the Y direction and south pole 24 and north pole 28 resulting therefrom and a semiconductor body 30 with a first monolithically integrated magnetic field sensor 34 and a second monolithically integrated magnetic field sensor 38 and a plate-shaped, symmetrical ferromagnetic encoding element 40. The two magnetic field sensors 34 and 38 are spaced apart from one another in the Y direction. The encoding element 40 is movable in all spatial directions, and preferably has a size in the Y direction that is comparable to or greater than the permanent magnet 20. The semiconductor body 30 has an integrated analysis circuit.

In the illustration in FIG. 1b, a top view of the first embodiment according to the invention is shown in a view in the X-Z plane. Only the differences from FIG. 1a are explained below.

The permanent magnet 20 has two shanks 128 spaced apart in the X direction as north pole 28. Between the shanks 128 of the north pole 28, a floor region 130 is likewise implemented as north pole 28. As a result, the permanent magnet has a U-shaped design with a magnetization in the Y direction.

The semiconductor body 30 is arranged approximately in the center between the shanks 128. The semiconductor body 30 is spaced apart from the floor region 130 in the Z direction. The encoding element 40 preferably has a size that is comparable to or greater than the permanent magnet 20 in the X direction as well. As a result, the encoding element 40 overlaps the two magnetic field sensors 24 and 28 equally, and in other words the encoding element 40 influences the two magnetic field sensors 34 and 38 symmetrically.

In the illustration in FIG. 1c, a top view of the first embodiment according to the invention is shown in a view in the X-Y plane. Only the differences from FIG. 1a and FIG. 1b are explained below.

In the Y direction, the permanent magnet 20 has the south pole 24 abutting the north pole 28. The south pole 24 is designed identically to the north pole 28 from a geometric standpoint, which is to say that the south pole 24 has two shanks 124 and a floor region 130 located between them. The shanks 124 of the south pole 24 and the shanks 128 of the north pole 28 are formed along the Y axis.

The first magnetic field sensor 34 is located in the region between the two shanks 124 of the south pole 24, and the second magnetic field sensor 28 is located between the two shanks 128 of the north pole 28. The semiconductor body 30 has its longitudinal axis along the Y axis and is located precisely centered or nearly centered between the shanks 24 and 28 of the magnet 20. The two magnetic field sensors 34 and 38 are spaced apart from one another in the Y direction along the longitudinal axis. In other words, the normal formed in the Z direction at the location of the geometric center of the permanent magnet 20, starting from the center of the floor region 130, passes through the centroid at the surface of the semiconductor body 30 and thereby also bisects the imaginary distance line between the two magnetic field sensors 34 and 38 at the surface of the semiconductor body 30.

The illustration in FIG. 2a shows a top view of a second embodiment according to the invention of a distance measuring device 10 in a view in the Y-Z plane. The distance measuring device 10 includes a permanent magnet 20 with a direction of magnetization opposite the Y direction and south pole 24 and north pole 28 resulting therefrom and a semiconductor body 30 with a first monolithically integrated magnetic field sensor 34 and a second monolithically integrated magnetic field sensor 38 and a plate-shaped, symmetrical ferromagnetic encoding element 40. The encoding element 40 is movable in all spatial directions, and preferably has a size in the Y direction that is comparable to or greater than the permanent magnet 20. The semiconductor body 30 has an integrated analysis circuit.

In the illustration in FIG. 2b, a top view of the second embodiment according to the invention is shown in a view in the X-Z plane. Only the differences from FIG. 2a are explained below.

The permanent magnet 20 has two shanks 128 spaced apart in the X direction as north pole 28. Between the shanks 128 of the north pole 28, a floor region 130 is likewise implemented as north pole 28. As a result, the permanent magnet has a U-shaped design with a magnetization in the Y direction. The permanent magnet 20 has a hole 140 in the center of the floor region 130.

The semiconductor body 30 is located approximately in the center between the shanks 128 and, when viewed in the Z direction, above the hole 140. The semiconductor body 30 is spaced apart from the floor region 130 in the Z direction. The encoding element 40 preferably has a size that is comparable to or greater than the permanent magnet 20 in the X direction as well. As a result, the encoding element 40 overlaps the two magnetic field sensors 24 and 28 equally, and in other words influences the two magnetic field sensors symmetrically.

In the illustration in FIG. 2c, a top view of the second embodiment according to the invention is shown in a view in the X-Y plane. Only the differences from FIG. 2a and FIG. 2b are explained below.

In the Y direction, the permanent magnet 20 has the south pole 24 abutting the north pole 28. The south pole 24 is designed identically to the north pole 28 from a geometric standpoint, which is to say that the south pole 24 has two shanks 124 and a floor region 134 located between them. The shanks 124 of the south pole 24 and the shanks 128 of the north pole 28 are formed along the Y axis. The hole 140 is quadrilateral in design and contains the centroid of the floor region 130. Half of the area of the hole 140 is located in the floor region 130 of the north pole 28, and the other half of the area of the hole 140 is located in the floor region 130 of the south pole 24.

The first magnetic field sensor 34 is located in the region between the two shanks 124 of the south pole 24, and the second magnetic field sensor 28 is located between the two shanks 128 of the north pole 28. The semiconductor body 30 is located precisely centered or nearly centered between the shanks 24 and 28 of the magnet 20, and in the Z direction is located in the center, preferably precisely in the center, over the hole 140.

In other words, the normal formed in the Z direction at the location of the geometric center of the permanent magnet 20, starting from the center of the floor region 130, passes through the centroid at the surface of the semiconductor body 30 and thereby also bisects the imaginary distance line between the two magnetic field sensors 34 and 38 at the surface of the semiconductor body 30.

The illustration in FIG. 3a shows a top view of a third embodiment according to the invention of a distance measuring device 10 in a view in the Y-Z plane. The distance measuring device 10 includes a permanent magnet 20 with a direction of magnetization in the X direction and a north pole 28 as well as a south pole 24 hidden by the north pole 28, and a semiconductor body 30 with a first monolithically integrated magnetic field sensor 34 and a second monolithically integrated magnetic field sensor 38 hidden by the first magnetic field sensor 34 and a plate-shaped, symmetrical ferromagnetic encoding element 40. The encoding element 40 is movable in all spatial directions, and preferably has a size in the Y direction that is comparable to or greater than the permanent magnet 20. The semiconductor body 30 has an integrated analysis circuit.

In the illustration in FIG. 3b, a top view of the third embodiment according to the invention is shown in a view in the X-Z plane. Only the differences from FIG. 3a are explained below.

The permanent magnet 20 has two shanks 124 and 128 that are each formed in the Y direction and are spaced apart in the X direction. Formed between the shank 124 of the south pole and the shank 128 of the north pole 28 is a floor region 130, half as south pole 24 and the remaining half as north pole 28; in other words the polarity changes along the X axis in the center of the floor region 130. The permanent magnet has a U-shaped design with a magnetization in the X direction.

The permanent magnet 20 can have a hole 140 in the center of the floor region 130.

The semiconductor body 30 is located approximately in the center between the shank 124 and the shank 128 and, when viewed in the Z direction, above the floor region 130. The semiconductor body 30 is spaced apart from the floor region 130 in the Z direction. The encoding element 40 preferably has a size that is comparable to or greater than the permanent magnet 20 in the X direction as well. As a result, the encoding element 40 overlaps the two magnetic field sensors 24 and 28 equally, and in other words the two magnetic field sensors are influenced symmetrically by the encoding element 40.

In the illustration in FIG. 3c, a top view of the third embodiment according to the invention is shown in a view in the X-Y plane. Only the differences from FIG. 3a and FIG. 3b are explained below.

In the X direction, the permanent magnet 20 has the south pole 24 abutting the north pole 28. The south pole 24 is designed identically to the north pole 28 from a geometric standpoint. The shank 124 of the south pole 24 and the shank 128 of the north pole 28 are each formed along the Y axis and are parallel opposite one another.

The first magnetic field sensor 34 is located above the floor region 130 of the south pole 24, and the second magnetic field sensor 28 is located above the floor region 130 of the north pole 28. The semiconductor body 30 is located precisely centered or nearly centered between the shanks 24 and 28 of the magnet 20 and in the Z direction. The two magnetic field sensors 34 and 38 are spaced apart from one another in the X direction along the longitudinal axis of the semiconductor body 30.

In other words, the normal formed in the Z direction at the location of the geometric center of the permanent magnet 20, starting from the center of the floor region 130, passes through the centroid at the surface of the semiconductor body 30 and thereby also bisects the imaginary distance line between the two magnetic field sensors 34 and 38 at the surface of the semiconductor body 30.

The floor region 130 can include the hole 140. The hole 140 is quadrilateral in design and contains the centroid of the floor region 130. Half of the area of the hole 140 is located in the floor region 130 of the north pole 28, and the other half of the area of the hole 140 is located in the floor region 130 of the south pole 24.

The semiconductor body 30 is located precisely centered or nearly centered between the shanks 24 and 28 of the magnet 20, and in the Z direction is located in the center, preferably precisely in the center, over the hole 140.

The illustration in FIG. 4a shows a top view of a fourth embodiment according to the invention of a distance measuring device 10 in a view in the Y-Z plane. The distance measuring device 10 includes a permanent magnet 20 with a direction of magnetization opposite the Y direction and south pole 24 and north pole 28 resulting therefrom and a semiconductor body 30 with a first monolithically integrated magnetic field sensor 34 and a second monolithically integrated magnetic field sensor 38 and a plate-shaped, symmetrical ferromagnetic encoding element 40. The two magnetic field sensors 34 and 38 are spaced apart from one another in the Y direction. The encoding element 40 is movable in all spatial directions, and preferably has a size in the Y direction that is comparable to or greater than the permanent magnet 20. The semiconductor body 30 has an integrated analysis circuit.

In the Y direction, the permanent magnet 20 has the south pole 24 abutting the north pole 28. The south pole 24 is designed identically to the north pole 28 from a geometric standpoint. The shanks 124 of the south pole 24 and the shanks 128 of the north pole 28 are each formed along the X axis and are located opposite one another in a parallel fashion.

The first magnetic field sensor 34 is located above the floor region 130 of the south pole 24, and the second magnetic field sensor 28 is located above the floor region 130 of the north pole 28. The semiconductor body 30 is located precisely centered or nearly centered between the shanks 24 and 28 of the magnet 20, and is spaced apart from the floor region 130 in the Z direction. The two magnetic field sensors 34 and 38 are spaced apart from one another in the Y direction along the longitudinal axis of the semiconductor body 30.

Figure 4B:
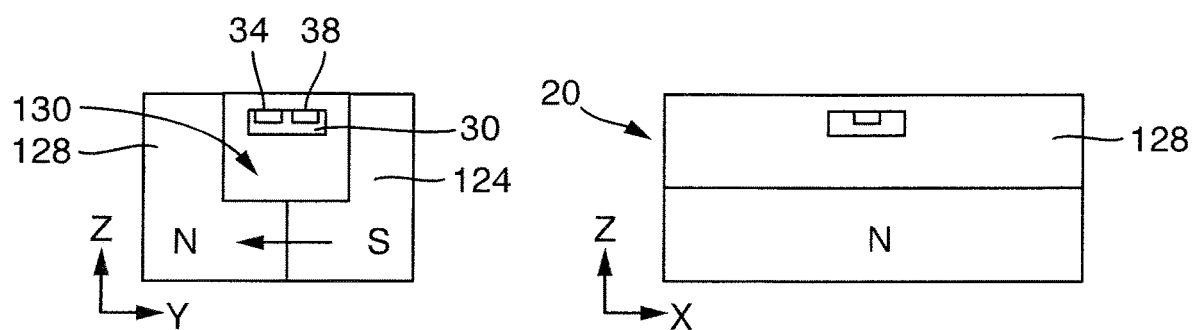
FIG. 4b is a top view of the embodiment according to the invention in a view in the X-Z plane.

In the illustration in FIG. 4b, a top view of the fourth embodiment according to the invention is shown in a view in the X-Z plane. Only the differences from FIG. 4a are explained below.

The semiconductor body 30 is not visible, but instead is hidden by the shank 128. The encoding element 40 preferably has a size that is comparable to or greater than the permanent magnet 20 in the X direction as well. As a result, the encoding element 40 overlaps the two magnetic field sensors 24 and 28 equally, and in other words the encoding element 40 influences the two magnetic field sensors 34 and 38 symmetrically.

The permanent magnet 20 can have a hole 140 in the center of the floor region 130.

Figure 4C:
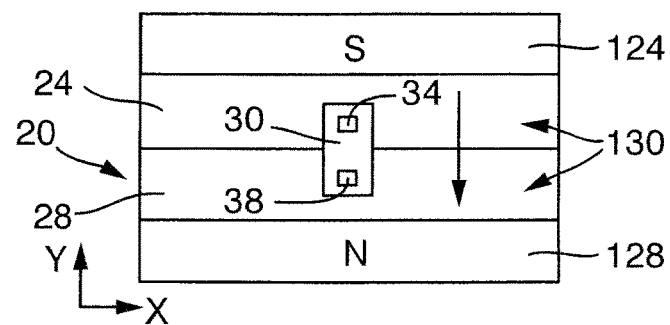
FIG. 4c is a top view of the embodiment according to the invention in a view in the X-Y plane.

In the illustration in FIG. 4c, a top view of the fourth embodiment according to the invention is shown in a view in the X-Y plane. Only the differences from FIG. 4a and FIG. 4b are explained below.

In the Y direction, the permanent magnet 20 has the south pole 24 abutting the north pole 28. The south pole 24 is designed identically to the north pole 28 from a geometric standpoint, which is to say that the south pole 24 has a shank 124 and a floor region 130 located between them. The shank 124 of the south pole 24 and the shank 128 of the north pole 28 are formed opposite and parallel to one another along the X axis.

The first magnetic field sensor 34 is located in the region between the shanks 124 of the south pole 24, and the second magnetic field sensor 28 is located between the two shanks 128 of the north pole 28. The semiconductor body 30 has its longitudinal axis along the Y axis and is located precisely centered or nearly centered between the shanks 24 and 28 of the magnet 20. The two magnetic field sensors 34 and 38 are spaced apart from one another in the Y direction along the longitudinal axis.

In other words, the normal formed in the Z direction at the location of the geometric center of the permanent magnet 20, starting from the center of the floor region 130, passes through the centroid at the surface of the semiconductor body 30 and thereby also bisects the imaginary distance line between the two magnetic field sensors 34 and 38 at the surface of the semiconductor body 30.

The floor region 130 can include the hole 140. The hole 140 is quadrilateral in design and contains the centroid of the floor region 130. Half of the area of the hole 140 is located in the floor region 130 of the north pole 28, and the other half of the area of the hole 140 is located in the floor region 130 of the south pole 24.

The semiconductor body 30 is located precisely centered or nearly centered between the shanks 24 and 28 of the magnet 20, and in the Z direction is located in the center, preferably precisely in the center, over the hole 140.

Figure 5A:
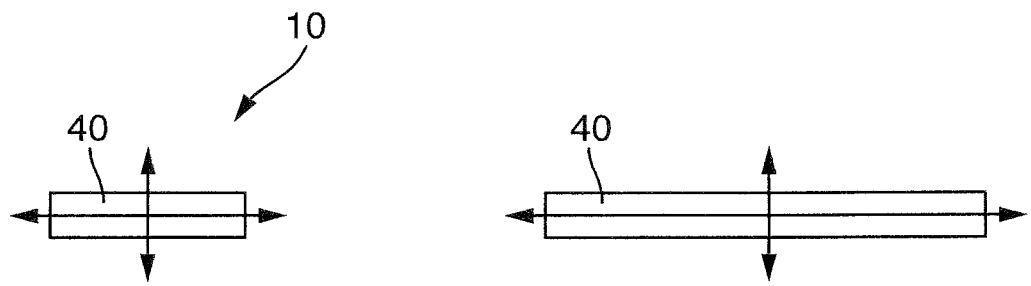
FIG. 5a is a top view of an embodiment according to the invention in a view in the Y-Z plane.
Figure 5A:
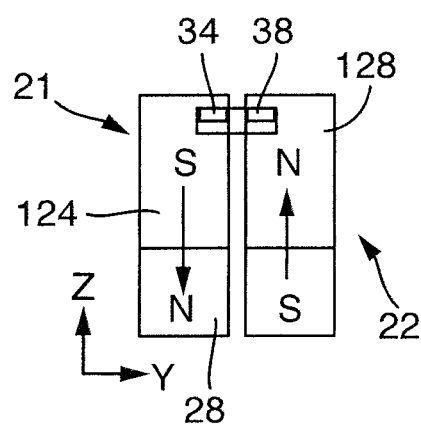

The illustration in FIG. 5a shows a top view of a fifth embodiment according to the invention of a distance measuring device 10 in a view in the Y-Z plane. The distance measuring device 10 includes a permanent magnet 20 composed of a first part 21 and a second part 22 with a direction of magnetization in or opposite to the Z direction and a south pole 24 and north pole 28 each resulting therefrom and a semiconductor body 30 with a first monolithically integrated magnetic field sensor 34 and a second monolithically integrated magnetic field sensor 38 and a plate-shaped, symmetrical ferromagnetic encoding element 40. The first part 21 of the permanent magnet 20 and the second part 22 of the permanent magnet 20 each have a vertical magnetization, i.e., magnetization formed in the direction of the Z axis. The two magnetic field sensors 34 and 38 are spaced apart from one another in the Y direction. The encoding element 40 is movable in all spatial directions, and preferably has a size in the Y direction that is comparable to or greater than the permanent magnet 20. The semiconductor body 30 has an integrated analysis circuit.

The first part 21 and the second part 22 of the permanent magnet are spaced apart from one another by a gap smaller than 10 mm, preferably smaller than 3 mm. The two parts can be joined to one another with no gap by a magnetic frictional connection.

In the Y direction, the south pole 24 of the second part 22 of the permanent magnet 20 abuts the first part 21 of the permanent magnet 20 at the north pole 28 at the bottom. At the top, the north pole 28 of the second part 22 of the permanent magnet 20 abuts the south pole of the first part 21 of the permanent magnet 20. In other words, the first part 21 of the permanent magnet 20 has an opposite direction of magnetization from the second part 22 of the permanent magnet 20.

The first magnetic field sensor 34 is located above the floor region 130 of the south pole 24, and the second magnetic field sensor 28 is located above the floor region 130 of the north pole 28. The semiconductor body 30 is located precisely centered or nearly centered between the shanks 24 and 28 of the magnet 20, and is spaced apart from the floor region 130 in the Z direction. The two magnetic field sensors 34 and 38 are spaced apart from one another along the longitudinal axis of the semiconductor body 30 implemented in the Y direction.

Figure 5B:
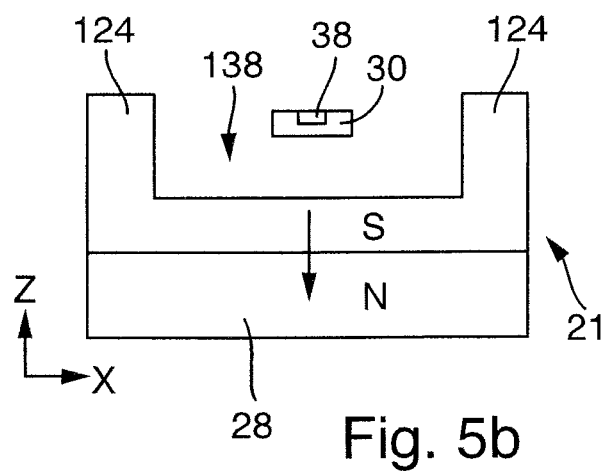
FIG. 5b is a top view of the embodiment according to the invention in a view in the X-Z plane.

In the illustration in FIG. 5b, a top view of the fifth embodiment according to the invention is shown in a view in the X-Z plane. Only the differences from FIG. 5a are explained below.

The semiconductor body 30 is implemented along the Y direction and only visible at the top surface. The encoding element 40 preferably has a size that is comparable to or greater than the permanent magnet 20 in the X direction as well. As a result, the encoding element 40 overlaps the two magnetic field sensors 24 and 28 equally, and in other words the encoding element 40 influences the two magnetic field sensors 34 and 38 symmetrically.

The permanent magnet 20 can have a hole 140 in the center of the floor region 130.

Figure 5C:
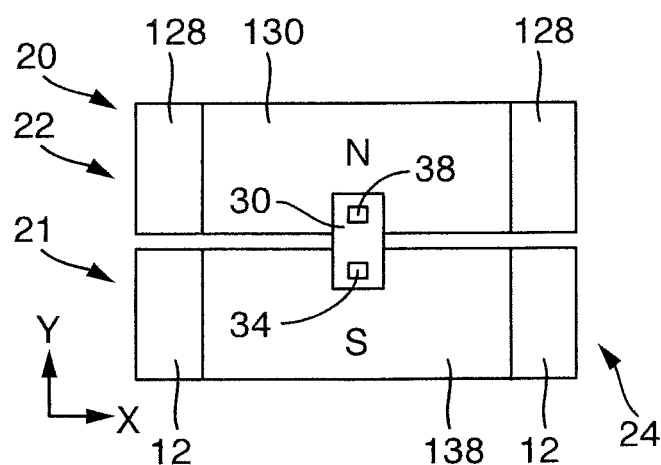
FIG. 5c is a top view of the embodiment according to the invention in a view in the X-Y plane.

In the illustration in FIG. 5c, a top view of the fifth embodiment according to the invention is shown in a view in the X-Y plane. Only the differences from FIG. 5a and FIG. 5b are explained below.

The south pole 24 of the first part 21 is designed identically to the north pole 28 of the second part 22 from a geometric standpoint. Both of the two opposing shanks 124 of the south pole 24 of the first part 21 and both of the two opposing shanks 128 of the north pole 28 of the second part 22 are formed along the X direction. The mutually opposing shanks 124 and the mutually opposing shanks 128 are designed to be parallel in the X direction.

In the Y direction, the permanent magnet 20 has the north pole 28 of the second part 22 abutting the south pole 24 of the first part 21. The south pole 24 of the first part 21 is designed identically to the north pole 28 of the second part 22 from a geometric standpoint, which is to say that the south pole 24 of the first part 21 has two shanks 124 located opposite one another and a floor region 130 lying between them, in exactly the same way as the north pole 28 of the second part 22 has two shanks 128 located opposite one another and a floor region 130 lying between them.

The first magnetic field sensor 34 is located in the region between the shanks 124 of the south pole 24, and the second magnetic field sensor 28 is located between the two shanks 128 of the north pole 28. The semiconductor body 30 has its longitudinal axis along the Y axis and is located precisely centered or nearly centered between the shanks 24 and 28 of the magnet 20. The two magnetic field sensors 34 and 38 are spaced apart from one another in the Y direction along the longitudinal axis. The polarity change between the south pole 24 and the north pole 28 extends along the center line in the center of the floor region 130 parallel to the Y axis.

In other words, the normal formed in the Z direction, starting from the center of the floor region 130, passes through the centroid at the surface of the semiconductor body 30 at the location of the geometric center of the permanent magnet 20 and thereby also bisects the imaginary distance line between the two magnetic field sensors 34 and 38 at the surface of the semiconductor body 30.

The floor region 130 includes the hole 140. The hole 140 is quadrilateral in design and contains the centroid of the floor region 130. Half of the area of the hole 140 is located in the floor region 130 of the north pole 28, and the other half of the area of the hole 140 is located in the floor region 130 of the south pole 24.

The semiconductor body 30 is located precisely centered or nearly centered between the shanks 24 and 28 of the magnet 20, and in the Z direction is located in the center, preferably precisely in the center, over the hole 140.

Figures 6A, 6B:
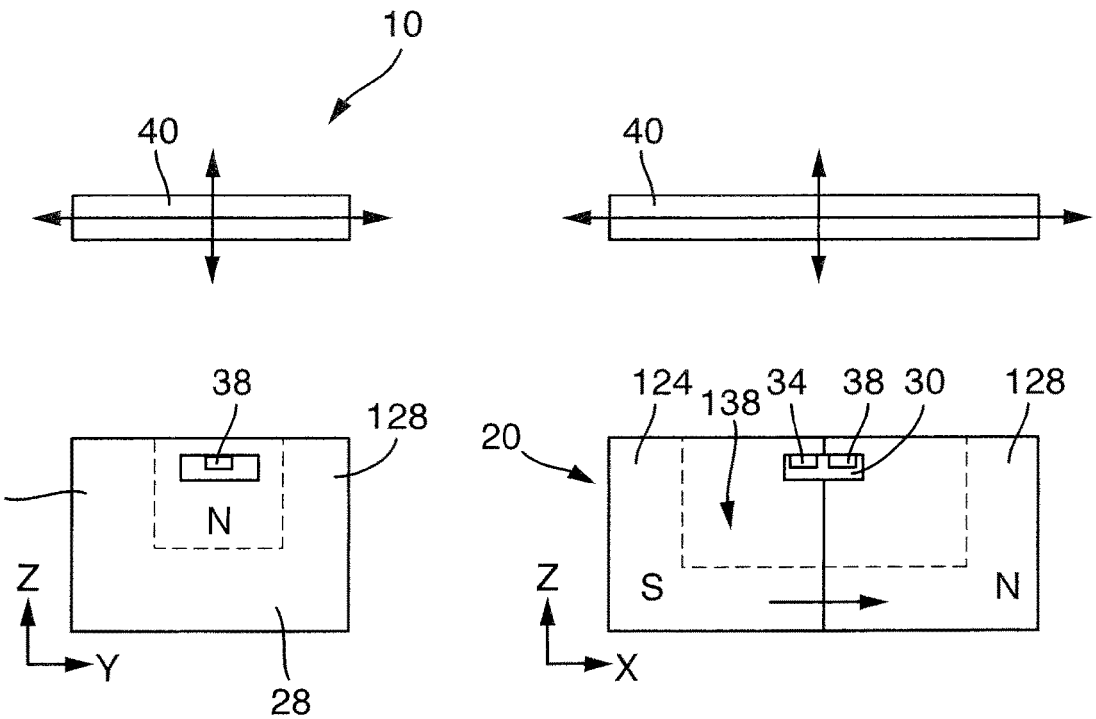
FIG. 6a is a top view of an embodiment according to the invention in a view in the Y-Z plane.
FIG. 6b is a top view of the embodiment according to the invention in a view in the X-Z plane.

The illustration in FIG. 6a shows a top view of a sixth embodiment according to the invention of a distance measuring device 10 in a view in the Y-Z plane. The distance measuring device 10 includes a permanent magnet 20 with a direction of magnetization in the X direction and north pole 28 resulting therefrom and a south pole 24 hidden by the north pole 28 and a semiconductor body 30 with a first monolithically integrated magnetic field sensor 34 and a second monolithically integrated magnetic field sensor 38 and a plate-shaped, symmetrical ferromagnetic encoding element 40. The encoding element 40 is movable in all spatial directions, and preferably has a size in the Y direction that is comparable to or greater than the permanent magnet 20. The semiconductor body 30 has an integrated analysis circuit. In the present case, the first magnetic field sensor 34 is hidden by the second magnetic field sensor 38.

In the illustration in FIG. 6b, a top view of the sixth embodiment according to the invention is shown in a view in the X-Z plane. Only the differences from FIG. 6a are explained below.

The circular and cup-shaped permanent magnet 20 has a semicircular shank 124 of the south pole 24 and an opposing semicircular shank 128 of the north pole 28. Formed between the shank 124 of the south pole 24 and the shank 128 of the north pole 28 is a floor region 130, half as south pole 24 and the remaining half as north pole 28; in other words the polarity changes along the X axis in the center of the floor region 130. The surface at which the polarity changes from south to north is implemented in the Y-Z plane. The permanent magnet has a magnetization in the X direction.

The semiconductor body 30 has a longitudinal axis in the X direction and is located approximately in the center between the shank 124 and the shank 128 and, when viewed in the Z direction, above the floor region 130. The semiconductor body 30 is spaced apart from the floor region 130 in the Z direction. The encoding element 40 preferably has a size that is comparable to or greater than the permanent magnet 20 in the X direction as well. As a result, the encoding element 40 overlaps the two magnetic field sensors 24 and 28 equally, and in other words the two magnetic field sensors are influenced symmetrically by the encoding element 40.

Figure 6C:
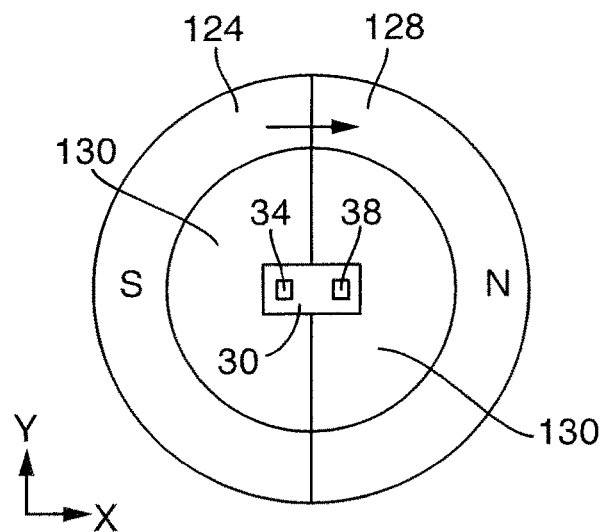
FIG. 6c is a top view of the embodiment according to the invention in a view in the X-Y plane.

In the illustration in FIG. 6c, a top view of the sixth embodiment according to the invention is shown in a view in the X-Y plane. Only the differences from FIG. 6a and FIG. 6b are explained below.

In the X direction, the permanent magnet 20 has the north pole 28 abutting the south pole 24. The south pole 24 is designed identically to the north pole 28 from a geometric standpoint. The semicircular shank 124 of the south pole 24 and the semicircular shank 128 of the north pole 28 are for the most part located opposite one another and contact one another at the surface Y-Z at which the polarity change takes place.

The first magnetic field sensor 34 is located above the floor region 130 of the south pole 24, and the second magnetic field sensor 28 is located above the floor region 130 of the north pole 28. The semiconductor body 30 is located precisely centered or nearly centered between the two semicircular shanks 24 and 28 of the magnet 20, and is spaced apart from the floor region 130 in the Z direction. The two magnetic field sensors 34 and 38 are spaced apart from one another in the X direction along the longitudinal axis of the semiconductor body 30.

In other words, the normal formed in the Z direction at the location of the geometric center of the permanent magnet 20, starting from the center of the floor region 130, passes through the centroid at the surface of the semiconductor body 30 and thereby also bisects the imaginary distance line between the two magnetic field sensors 34 and 38 at the surface of the semiconductor body 30.

The illustration in FIG. 7a shows a top view of a seventh embodiment according to the invention of a distance measuring device 10 in a view in the Y-Z plane. The distance measuring device 10 includes a permanent magnet 20 with a direction of magnetization in the X direction and north pole 28 resulting therefrom and a south pole 24 hidden by the north pole 28 and a semiconductor body 30 with a first monolithically integrated magnetic field sensor 34 and a second monolithically integrated magnetic field sensor 38 and a plate-shaped, symmetrical ferromagnetic encoding element 40. The encoding element 40 is movable in all spatial directions, and preferably has a size in the Y direction that is comparable to or greater than the permanent magnet 20. The semiconductor body 30 has an integrated analysis circuit. In the present case, the first magnetic field sensor 34 is hidden by the second magnetic field sensor 38.

In the illustration in FIG. 7b, a top view of the seventh embodiment according to the invention is shown in a view in the X-Z plane. Only the differences from FIG. 7a are explained below.

The circular and cup-shaped permanent magnet 20 has a semicircular shank 124 of the south pole 24 and an opposing semicircular shank 128 of the north pole 28. Formed between the shank 124 of the south pole 24 and the shank 128 of the north pole 28 is a floor region 130, half as south pole 24 and the remaining half as north pole 28; in other words, the polarity changes along the X axis in the center of the floor region 130. The surface at which the polarity changes from south to north is implemented in the Y-Z plane. The permanent magnet has a magnetization in the X direction.

The semiconductor body 30 has a longitudinal axis in the X direction and is located approximately in the center between the shank 124 and the shank 128 and, when viewed in the Z direction, above the floor region 130, but within the height of the shanks 124 and 128 formed in the Z direction. The semiconductor body 30 is spaced apart from the floor region 130 in the Z direction. The encoding element 40 preferably has a size that is comparable to or greater than the permanent magnet 20 in the X direction as well. As a result, the encoding element 40 overlaps the two magnetic field sensors 24 and 28 equally, and in other words the two magnetic field sensors are influenced symmetrically by the encoding element 40.

In the center of the floor region 130, the permanent magnet has a hole 140.

In the illustration in FIG. 7c, a top view of the seventh embodiment according to the invention is shown in a view in the X-Y plane. Only the differences from FIG. 7a and FIG. 7b are explained below.

In the X direction, the permanent magnet 20 has the north pole 28 abutting the south pole 24. The south pole 24 is designed identically to the north pole 28 from a geometric standpoint. The semicircular shank 124 of the south pole 24 and the semicircular shank 128 of the north pole 28 are for the most part located opposite one another and contact one another at the surface Y-Z at which the polarity change takes place.

The first magnetic field sensor 34 is located above the floor region 130 of the south pole 24, and the second magnetic field sensor 28 is located above the floor region 130 of the north pole 28. The semiconductor body 30 is located precisely centered or nearly centered between the two semicircular shanks 24 and 28 of the magnet 20, and is spaced apart from the floor region 130 in the Z direction. The two magnetic field sensors 34 and 38 are spaced apart from one another in the X direction along the longitudinal axis of the semiconductor body 30.

The hole 140 located in the central floor region 130 is round in design and contains the centroid of the floor region 130. Half of the area of the hole 140 is located in the floor region 130 of the north pole 28, and the other half of the area of the hole 140 is located in the floor region 130 of the south pole 24.

The first magnetic field sensor 34 is located in the region surrounded by the semicircular shank 124 of the south pole 24, and the second magnetic field sensor 38 is located in the region surrounded by the semicircular shank 128 of the north pole 28. As a result, the semiconductor body 30 is in the center of the semicircular shank 124 of the south pole 24 and the semicircular shank 128 of the north pole 28, and in the Z direction is located in the center, preferably precisely in the center, over the hole 140.

In other words, the normal formed in the Z direction at the location of the geometric center of the permanent magnet 20, starting from the center of the floor region 130, which is to say at the location where the hole 140 is formed, passes through the centroid at the surface of the semiconductor body 30 and thereby also bisects the imaginary distance line formed in the X direction between the two magnetic field sensors 34 and 38 at the surface of the semiconductor body 30.

The illustration in FIG. 8a shows a top view of an eighth embodiment according to the invention of a distance measuring device 10 in a view in the Y-Z plane. The distance measuring device 10 includes a permanent magnet 20 with a direction of magnetization in the X direction and north pole 28 resulting therefrom and a south pole 24 hidden by the north pole 28 and a semiconductor body 30 with a first monolithically integrated magnetic field sensor 34 and a second monolithically integrated magnetic field sensor 38 and a plate-shaped, symmetrical ferromagnetic encoding element 40. The encoding element 40 is movable in all spatial directions, and preferably has a size in the Y direction that is comparable to or greater than the permanent magnet 20. The semiconductor body 30 has an integrated analysis circuit. In the present case, the first magnetic field sensor 34 is hidden by the second magnetic field sensor 38.

In the illustration in FIG. 8b, a top view of the eighth embodiment according to the invention is shown in a view in the X-Z plane. Only the differences from FIG. 8a are explained below.

The quadrilateral and cup-like permanent magnet 20 has a U-shaped shank 124 of the south pole 24 that is formed in the X direction and an opposing U-shaped shank 128 of the north pole 28 that is likewise formed in the X direction. Formed between the shank 124 of the south pole 24 and the shank 128 of the north pole 28 is a floor region 130, half as south pole 24 and the remaining half as north pole 28; in other words, the polarity changes along the X axis in the center of the floor region 130. The surface at which the polarity changes from south to north is implemented in the Y-Z plane. The permanent magnet has a magnetization in the X direction.

The semiconductor body 30 has a longitudinal axis in the X direction and is located approximately in the center between the shank 124 and the shank 128 and, when viewed in the Z direction, above the floor region 130, but within the height of the shanks 124 and 128 formed in the Z direction. The semiconductor body 30 is spaced apart from the floor region 130 in the Z direction. The encoding element 40 preferably has a size that is comparable to or greater than the permanent magnet 20 in the X direction as well. As a result, the encoding element 40 overlaps the two magnetic field sensors 24 and 28 equally, and in other words the two magnetic field sensors are influenced symmetrically by the encoding element 40.

A quadrilateral hole 140 can be formed in the center of the floor region 130.

In the illustration in FIG. 8c, a top view of the eighth embodiment according to the invention is shown in a view in the X-Y plane. Only the differences from FIG. 8a and FIG. 8b are explained below.

In the X direction, the permanent magnet 20 has the north pole 28 abutting the south pole 24. The south pole 24 is designed identically to the north pole 28 from a geometric standpoint. The U-shaped shank 124 of the south pole 24 and the U-shaped shank 128 of the north pole 28 are for the most part located opposite one another and contact one another at the surface Y-Z at which the polarity change takes place.

The first magnetic field sensor 34 is located above the floor region 130 of the south pole 24, and the second magnetic field sensor 28 is located above the floor region 130 of the north pole 28. The semiconductor body 30 is located precisely centered or nearly centered between the two U-shaped shanks 24 and 28 of the magnet 20, and is spaced apart from the floor region 130 in the Z direction. The two magnetic field sensors 34 and 38 are spaced apart from one another in the X direction along the longitudinal axis of the semiconductor body 30.

The geometric center of the permanent magnet 20 is also located in the central floor region 130.

The first magnetic field sensor 34 is located in the region surrounded by the U-shaped shank 124 of the south pole 24 and the second magnetic field sensor 38 is located in the region surrounded by the U-shaped shank 128 of the north pole 28. As a result, the semiconductor body 30 is in the center of the U-shaped shank 124 of the south pole 24 and the U-shaped shank 128 of the north pole 28, and in the Z direction is located in the center, preferably precisely in the center, over the geometric center.

In other words, the normal formed in the Z direction at the location of the geometric center of the permanent magnet 20, starting from the center of the floor region 130, passes through the centroid at the surface of the semiconductor body 30 and thereby also bisects the imaginary distance line formed in the X direction between the two magnetic field sensors 34 and 38 at the surface of the semiconductor body 30.

The hole 140 can be quadrilateral in design in the central floor region 130 and contains the centroid of the floor region 130. Half of the area of the hole 140 is located in the floor region 130 of the north pole 28, and the other half of the area of the hole 140 is located in the floor region 130 of the south pole 24.

The normal formed in the Z direction at the location of the geometric center of the permanent magnet 20, starting from the center of the floor region 130, which is to say at the location where the hole 140 is formed, can pass through the centroid at the surface of the semiconductor body 30 and thereby also bisects the imaginary distance line formed in the X direction between the two magnetic field sensors 34 and 38 at the surface of the semiconductor body 30.

The illustration in FIG. 9a shows a top view of a ninth embodiment according to the invention of a distance measuring device 10 in a view in the Y-Z plane. The distance measuring device 10 includes a permanent magnet 20 with a direction of magnetization in the X direction and north pole 28 resulting therefrom and a south pole 24 hidden by the north pole 28 and a semiconductor body 30 with a first monolithically integrated magnetic field sensor 34 and a second monolithically integrated magnetic field sensor 38 and a plate-shaped, symmetrical ferromagnetic encoding element 40. The encoding element 40 is movable in all spatial directions, and preferably has a size in the Y direction that is comparable to or greater than the permanent magnet 20. The semiconductor body 30 has an integrated analysis circuit. In the present case, the first magnetic field sensor 34 is hidden by the second magnetic field sensor 38.

In the illustration in FIG. 9b, a top view of the ninth embodiment according to the invention is shown in a view in the X-Z plane. Only the differences from FIG. 9a are explained below.

The quadrilateral and partially cup-like permanent magnet 20 has an angular shank 124 of the south pole 24 implemented in the X-Y direction and an opposing angular shank 128 of the north pole 28, likewise implemented in the X-Y direction. Formed between the shank 124 of the south pole 24 and the shank 128 of the north pole 28 is a floor region 130, half as south pole 24 and the remaining half as north pole 28; in other words, the polarity changes along the X axis in the center of the floor region 130. The surface at which the polarity changes from south to north is implemented in the Y-Z plane. The permanent magnet has a magnetization in the X direction. The partially cup-like permanent magnet 20 is open when viewed in the direction of the Y axis, i.e., the enclosing wall is absent along an X-Z plane with regard to the floor region 130 as well.

The semiconductor body 30 has a longitudinal axis in the X direction and is located approximately in the center between the shank 124 and the shank 128 and, when viewed in the Z direction, above the floor region 130, but within the height of the shanks 124 and 128 formed in the Z direction. The semiconductor body 30 is spaced apart from the floor region 130 in the Z direction. The encoding element 40 preferably has a size that is comparable to or greater than the permanent magnet 20 in the X direction as well. As a result, the encoding element 40 overlaps the two magnetic field sensors 24 and 28 equally, and in other words the two magnetic field sensors are influenced symmetrically by the encoding element 40.

A quadrilateral hole 140 can be formed in the center of the floor region 130.

In the illustration in FIG. 9c, a top view of the ninth embodiment according to the invention is shown in a view in the X-Y plane. Only the differences from FIG. 9a and FIG. 9b are explained below.

In the X direction, the permanent magnet 20 has the north pole 28 abutting the south pole 24. The south pole 24 is designed identically to the north pole 28 from a geometric standpoint. The angular shank 124 of the south pole 24 and the angular shank 128 of the north pole 28 are for the most part located opposite one another and contact one another only at a single surface Y-Z at which the polarity change takes place.

The first magnetic field sensor 34 is located above the floor region 130 of the south pole 24, and the second magnetic field sensor 28 is located above the floor region 130 of the north pole 28. The semiconductor body 30 is located nearly centered between the two angular shanks 24 and 28 of the magnet 20, and is spaced apart from the floor region 130 in the Z direction. The two magnetic field sensors 34 and 38 are spaced apart from one another in the X direction along the longitudinal axis of the semiconductor body 30.

The geometric center of the permanent magnet 20 is also located in the central floor region 130.

The first magnetic field sensor 34 is located in the region surrounded by the angular shank 124 of the south pole 24 and the second magnetic field sensor 38 is located in the region surrounded by the angular shank 128 of the north pole 28. As a result, the semiconductor body 30 is approximately in the center of the angular shank 124 of the south pole 24 and the angular shank 128 of the north pole 28, and in the Z direction is located in the center, preferably precisely in the center, over the geometric center.

In other words, the normal formed in the Z direction at the location of the geometric center of the permanent magnet 20, starting from the center of the floor region 130, passes through the centroid at the surface of the semiconductor body 30 and thereby also bisects the imaginary distance line formed in the X direction between the two magnetic field sensors 34 and 38 at the surface of the semiconductor body 30.

The hole 140 can be quadrilateral in design in the central floor region 130 and contains the centroid of the floor region 130. Half of the area of the hole 140 is located in the floor region 130 of the north pole 28, and the other half of the area of the hole 140 is located in the floor region 130 of the south pole 24.

In other words, the normal formed in the Z direction at the location of the geometric center of the permanent magnet 20, starting from the center of the floor region 130, which is to say at the location where the hole 140 is formed, passes through the centroid at the surface of the semiconductor body 30 and thereby also bisects the imaginary distance line formed in the X direction between the two magnetic field sensors 34 and 38 at the surface of the semiconductor body 30.

The illustration in FIG. 10a shows a top view of a tenth embodiment according to the invention of a distance measuring device 10 in a view in the Y-Z plane. The distance measuring device 10 includes a permanent magnet 20 with a direction of magnetization opposite the Z direction and south pole 24 resulting therefrom and with a north pole 28 and a semiconductor body 30 with a first monolithically integrated magnetic field sensor 34 and a second monolithically integrated magnetic field sensor 38 and a plate-shaped ferromagnetic encoding element 40.

The encoding element 40 is movable in all spatial directions, and preferably has a size in the Y direction that is only approximately half as large as the permanent magnet 20 or less. The semiconductor body 30 has an integrated analysis circuit. In the present case, the first magnetic field sensor 34 is spaced apart in the Y direction from the second magnetic field sensor 38.

The permanent magnet 20 has a vertical magnetization formed in the Z direction, wherein the south pole 24 is located above the north pole 28.

In the illustration in FIG. 10b, a top view of the tenth embodiment according to the invention is shown in a view in the X-Z plane. Only the differences from FIG. 10a are explained below.

The permanent magnet 20, which is quadrilateral and only partially cup-like in design, has a U-shaped shank 124 of the south pole 24 formed in the X-Y direction, wherein the shanks 124 are formed parallel to one another along the Y direction, which is to say that the two shanks 124 are spaced apart in the X direction. A floor region 130 as south pole 24 is formed between the sides of the U-shaped shank 124 of the south pole 24; in other words, the polarity changes only along the Z direction. The magnetization is thus vertical in the Z direction. The partially cup-like permanent magnet 20 is open when viewed in the direction of the Y axis, i.e., the enclosing wall implemented as the south pole 24 is absent along an X-Z plane.

The semiconductor body 30 has a longitudinal axis in the Y direction and is located approximately in the center between the region formed out of the U-shaped shank 124 and, when viewed in the Z direction, above the floor region 130, but within the height of the shank 124 formed in the Z direction. The semiconductor body 30 is spaced apart from the floor region 130 in the Z direction. The encoding element 40 preferably has a size that is comparable to or greater than the permanent magnet 20 in the X direction as well. As a result, the encoding element 40 overlaps the two magnetic field sensors 24 and 28 unequally, or in other words, the two magnetic field sensors are influenced asymmetrically by the encoding element 40.

A quadrilateral hole 140 can be formed in the center of the floor region 130.

In the illustration in FIG. 10c, a top view of the tenth embodiment according to the invention is shown in a view in the X-Y plane. Only the differences from FIG. 10a and FIG. 10b are explained below. The encoding element 40 only partially covers the permanent magnet 20.

The U-shaped shank 124 of the south pole 24 encloses the floor region 130 only on three sides.

The two magnetic field sensors 34 and 38 are spaced apart from one another in the Y direction along the longitudinal axis of the semiconductor body 30, and are located above the floor region 130 of the south pole 24. The semiconductor body 30 is nearly centered between the U-shaped shank 24, and is spaced apart from the floor region 130 in the Z direction.

The geometric center of the permanent magnet 20 is also located in the central floor region 130.

The two magnetic field sensors 34 and 38 are located in the region of the U-shaped shank 124 of the south pole 24. The semiconductor body 30 is approximately in the middle of the U-shaped shank 124 of the south pole 24, and in the Z direction is located in the center, preferably precisely in the center, over the geometric center.

In other words, the normal formed in the Z direction at the location of the geometric center of the permanent magnet 20, starting from the center of the floor region 130, passes through the centroid at the surface of the semiconductor body 30 and thereby also bisects the imaginary distance line formed in the Y direction between the two magnetic field sensors 34 and 38 at the surface of the semiconductor body 30.

The hole 140 can be quadrilateral in design in the central floor region 130 and contains the centroid of the floor region 130.

In other words, the normal formed in the Z direction at the location of the geometric center of the permanent magnet 20, starting from the center of the floor region 130, which is to say at the location where the hole 140 is formed, passes through the centroid at the surface of the semiconductor body 30 and thereby also bisects the imaginary distance line formed in the X direction between the two magnetic field sensors 34 and 38 at the surface of the semiconductor body 30.

Figure 11A:
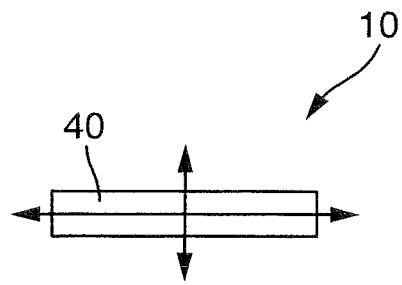
FIG. 11a is a top view of an embodiment according to the invention in a view in the Y-Z plane.
Figure 11A:
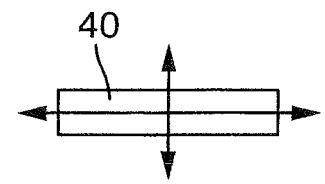
Figure 11A:
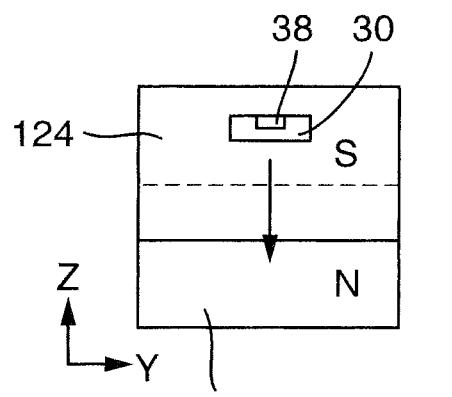

The illustration in FIG. 11a shows a top view of an eleventh embodiment according to the invention of a distance measuring device 10 in a view in the Y-Z plane. The distance measuring device 10 includes a permanent magnet 20 with a direction of magnetization opposite the Z direction and south pole 24 and north pole 28 resulting therefrom and a semiconductor body 30 with a first monolithically integrated magnetic field sensor 34 and a second monolithically integrated magnetic field sensor 38 and a plate-shaped ferromagnetic encoding element 40.

The two magnetic field sensors 34 and 38 are spaced apart from one another in the X direction. The encoding element 40 is movable in all spatial directions, and preferably has a size in the Y direction that is comparable to or greater than the permanent magnet 20. The semiconductor body 30 has an integrated analysis circuit.

The south pole 24 is located above the north pole 28 in the Z direction, which is to say that the permanent magnet 20 has a vertical magnetization.

Figure 11B:
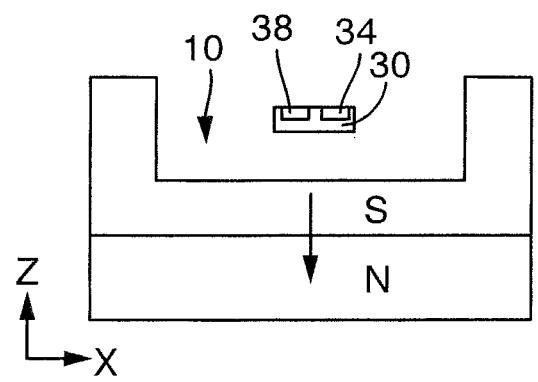
FIG. 11b is a top view of the embodiment according to the invention in a view in the X-Z plane.

In the illustration in FIG. 11b, a top view of the eleventh embodiment according to the invention is shown in a view in the X-Z plane. Only the differences from FIG. 11a are explained below.

The permanent magnet 20 has as south pole 24 two shanks 124 spaced apart in the X direction. Formed between the shanks 124 is a floor region 130, likewise as the south pole 124. As a result, the permanent magnet has a U-shaped design with a magnetization in the Z direction.

The semiconductor body 30 is located approximately in the center between the shanks 124. The semiconductor body 30 is spaced apart from the floor region 130 in the Z direction. The encoding element 40 has a size in the X direction that is only approximately half as large as the permanent magnet 20 or less. As a result, the encoding element 40 overlaps the two magnetic field sensors 24 and 28 unequally, and in other words the encoding element 40 influences the two magnetic field sensors 34 and 38 asymmetrically. In the present case, only one of the two magnetic field sensors 34 and 38 is covered.

Figure 11C:
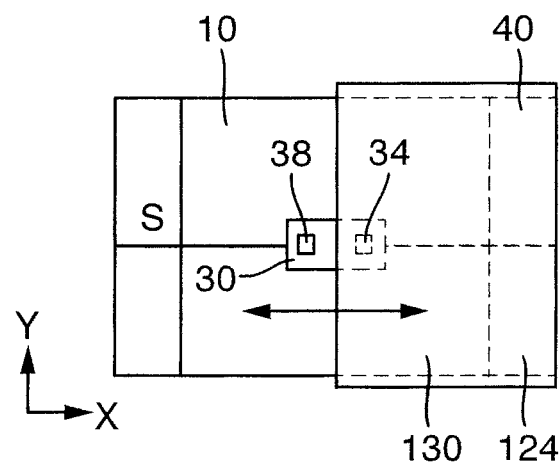
FIG. 11c is a top view of the embodiment according to the invention in a view in the X-Y plane.

In the illustration in FIG. 11c, a top view of the eleventh embodiment according to the invention is shown in a view in the X-Y plane. Only the differences from FIG. 11a and FIG. 11b are explained below. The encoding element 40 only partially covers the permanent magnet in the X-Y plane, preferably half of it. In particular, only one of the two magnetic field sensors 34 and 38 is covered.

In the Z direction, the permanent magnet 20 has the north pole 28 abutting the south pole 24. Only the south pole 24 has two shanks 124 and a floor region 130 lying between them. The shanks 124 of the south pole 124 are formed parallel to one another along the Y axis.

The two magnetic field sensors 34 and 38 are located in the region between the two shanks 124 of the south pole 24. The semiconductor body 30 has its longitudinal axis along the X direction and is located precisely centered or nearly centered between the shanks 24 of the magnet 20. The two magnetic field sensors 34 and 38, spaced apart from one another in the X direction along the longitudinal axis, are spaced apart from the floor region 130 in the Z direction.

The normal formed in the Z direction at the location of the geometric center of the permanent magnet 20, starting from the center of the floor region 130, passes through the centroid at the surface of the semiconductor body 30 and thereby also bisects the imaginary distance line between the two magnetic field sensors 34 and 38 at the surface of the semiconductor body 30.

A quadrilateral hole 140 can be formed in the central floor region 130 and contains the centroid of the floor region 130.

In other words, the normal formed in the Z direction at the location of the geometric center of the permanent magnet 20, starting from the center of the floor region 130, which is to say at the location where the hole 140 is formed, passes through the centroid at the surface of the semiconductor body 30 and thereby also bisects the imaginary distance line formed in the X direction between the two magnetic field sensors 34 and 38 at the surface of the semiconductor body 30.

Figure 12A:
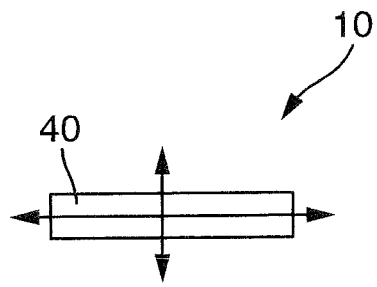
FIG. 12a is a top view of an embodiment according to the invention in a view in the Y-Z plane.
Figure 12A:
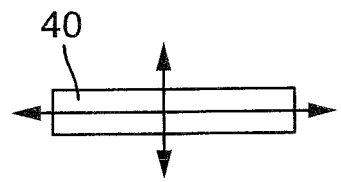
Figure 12A:
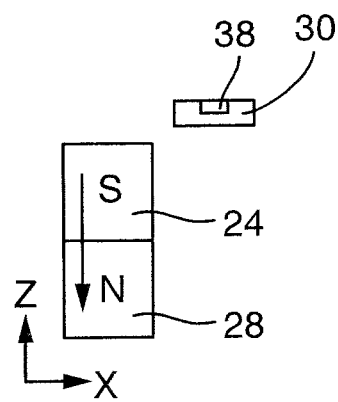

The illustration in FIG. 12a shows a top view of a twelfth embodiment according to the invention of a distance measuring device 10 in a view in the Y-Z plane. The distance measuring device 10 includes a permanent magnet 20 with a direction of magnetization opposite the Z direction and south pole 24 and north pole 28 resulting therefrom and a semiconductor body 30 with a first monolithically integrated magnetic field sensor 34 and a second monolithically integrated magnetic field sensor 38 and a plate-shaped ferromagnetic encoding element 40.

The encoding element 40 is movable in all spatial directions, and preferably has at least the size of the permanent magnet 20 in the Y direction. The semiconductor body 30 has an integrated analysis circuit.

The south pole 24 of the permanent magnet 20 is located on the north pole 28 in the Z direction. The permanent magnet 20 has a magnetization that extends vertically or in the Z direction.

The first magnetic field sensor 34 and the second magnetic field sensor 28 are located next to the upper edge of the south pole 24 in the Z direction.

Figure 12B:
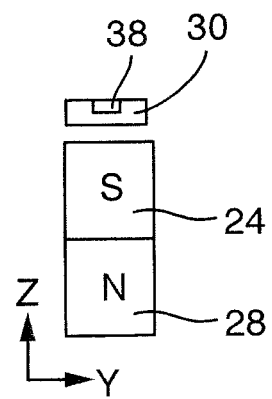
FIG. 12b is a top view of the embodiment according to the invention in a view in the X-Z plane.

In the illustration in FIG. 12b, a top view of the twelfth embodiment according to the invention is shown in a view in the X-Z plane. Only the differences from FIG. 12a are explained below.

The two magnetic field sensors 34 and 38 are spaced apart from one another along the longitudinal axis of the semiconductor body 30 implemented in the X direction.

The longitudinal axis of the semiconductor body 30 is implemented along the X direction and in the present case only the top surface of the semiconductor body 30 is visible. The encoding element 40 preferably has a size in the X direction that is comparable to or greater than the south pole 24 of the permanent magnet 20.

Figure 12C:
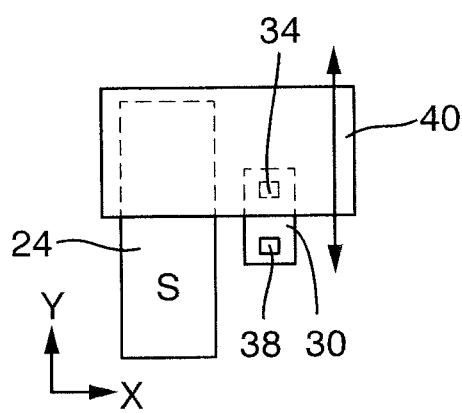
FIG. 12c is a top view of the embodiment according to the invention in a view in the X-Y plane.

In the illustration in FIG. 12c, a top view of the twelfth embodiment according to the invention is shown in a view in the X-Y plane. Only the differences from FIG. 12a and FIG. 12b are explained below.

The encoding element 40 overlaps only approximately half of the top of the south pole 24 and overlaps only one of the two spaced-apart magnetic field sensors 34 and 38 next to the south pole 24, or in other words, the encoding element 40 influences the two magnetic field sensors 34 and 38 asymmetrically.

The distance between the semiconductor body 30 and the south pole 24 is designed to be parallel and constant in the Y direction.

The illustration in FIG. 13a shows a top view of a thirteenth embodiment according to the invention of a distance measuring device 10 in a view in the Y-Z plane. The distance measuring device 10 includes a permanent magnet 20 with a direction of magnetization opposite the Z direction and south pole 24 and north pole 28 resulting therefrom, and a semiconductor body 30 with a first monolithically integrated magnetic field sensor 34 and a second monolithically integrated magnetic field sensor 38 and a plate-shaped ferromagnetic encoding element 40.

The encoding element 40 is movable in all spatial directions, and preferably has a size in the Y direction that is only approximately half as large as the permanent magnet 20 or less. The semiconductor body 30 has an integrated analysis circuit.

In the Z direction, the south pole 24 of the permanent magnet 20 is located on the north pole 28. The permanent magnet 20 has a magnetization that extends vertically or in the Z direction.

The first magnetic field sensor 34 and the second magnetic field sensor 28 are located at the top edge of the south pole 24 in the Z direction.

In the illustration in FIG. 13b, a top view of the thirteenth embodiment according to the invention is shown in a view in the X-Z plane. Only the differences from FIG. 13a are explained below.

The permanent magnet 20 includes a first part 21 and a second part 22. The first part 21 of the permanent magnet 20 and the second part 22 of the permanent magnet 20 each have a magnetization in the same direction extending vertically, i.e., in the direction of the Z axis. The two magnetic field sensors 34 and 38 are spaced apart from one another in the X direction by a gap.

The size of the gap is at least as large as the width of the semiconductor body 30 at its top surface. The two magnetic field sensors 34 and 38 are spaced apart from one another along the longitudinal axis of the semiconductor body 30 implemented in the Y direction.

The longitudinal axis of the semiconductor body 30 is implemented along the Y direction and in the present case only the top surface of the semiconductor body 30 is visible. The encoding element 40 has a size in the X direction that preferably is comparable to or greater than the two parts 21 and 22 of the permanent magnet 20.

In the illustration in FIG. 13c, a top view of the thirteenth embodiment according to the invention is shown in a view in the X-Y plane. Only the differences from FIG. 13a and FIG. 13b are explained below. The encoding element 40 overlaps only approximately half of the top of the two south poles and overlaps only one of the two magnetic field sensors 34 and 38, or in other words, the encoding element 40 influences the two magnetic field sensors 34 and 38 asymmetrically.

The south pole 24 of the first part 21 is designed identically to the south pole 24 of the second part 22 from a geometric standpoint. The south poles 24, located opposite one another, are designed to be parallel in the Y direction, which is to say that the gap is of equal width.

The first magnetic field sensor 34 is located in the region between the two south poles 24. The semiconductor body 30 is located precisely centered or nearly centered between the two south poles 24 of the two parts 21 and 22 of the permanent magnet 20.

Figures 14A, 14B:
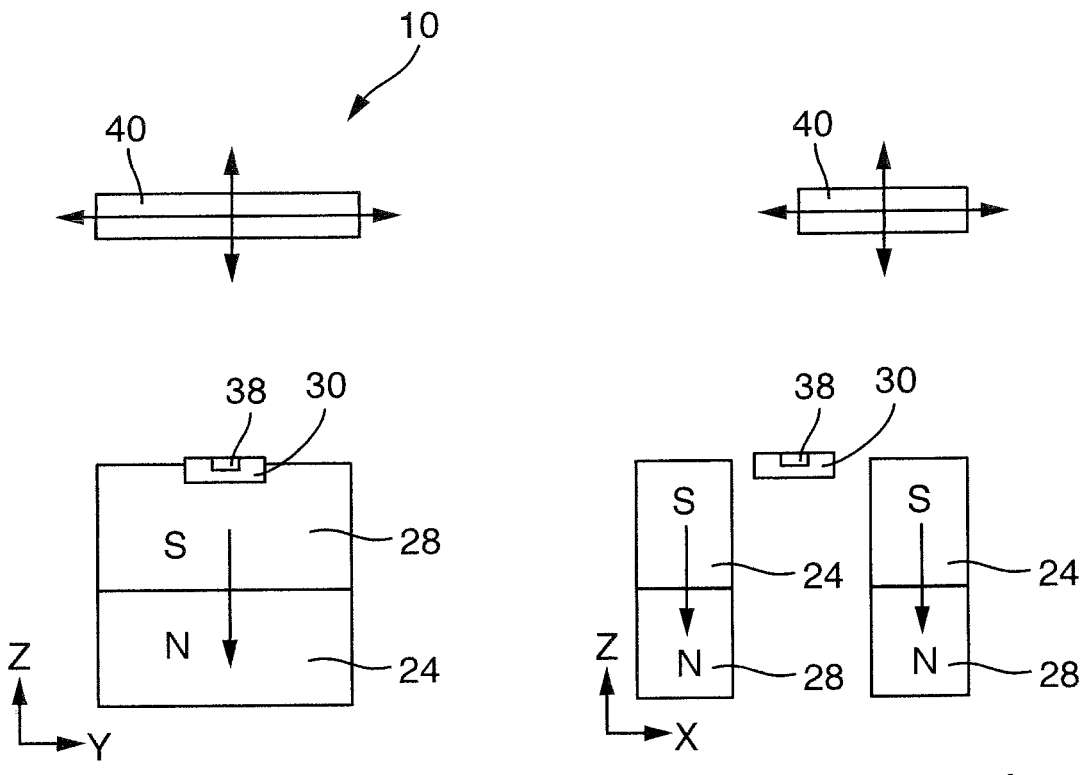
FIG. 14a is a top view of an embodiment according to the invention in a view in the Y-Z plane.
FIG. 14b is a top view of the embodiment according to the invention in a view in the X-Z plane.

The illustration in FIG. 14a shows a top view of a fourteenth embodiment according to the invention of a distance measuring device 10 in a view in the Y-Z plane. The distance measuring device 10 includes a permanent magnet 20 with a direction of magnetization opposite the Z direction and south pole 24 and north pole 28 resulting therefrom and a semiconductor body 30 with a first monolithically integrated magnetic field sensor 34 and a second monolithically integrated magnetic field sensor 38 and a plate-shaped ferromagnetic encoding element 40.

The encoding element 40 is movable in all spatial directions, and preferably has a size in the Y direction that is comparable to or greater than the permanent magnet 20. The semiconductor body 30 has an integrated analysis circuit.

In the Z direction, the south pole 24 of the permanent magnet 20 is located on the north pole 28. The permanent magnet 20 has a magnetization that extends vertically or in the Z direction.

The first magnetic field sensor 34 and the second magnetic field sensor 28 are located at the top edge of the south pole 24 in the Z direction.

In the illustration in FIG. 14b, a top view of the fourteenth embodiment according to the invention is shown in a view in the X-Z plane. Only the differences from FIG. 14a are explained below.

The permanent magnet 20 includes a first part 21 and a second part 22. The first part 21 of the permanent magnet 20 and the second part 22 of the permanent magnet 20 each have a magnetization in the same direction extending vertically, i.e., in the direction of the Z axis. The two magnetic field sensors 34 and 38 are spaced apart from one another in the X direction by a gap.

The size of the gap is at least as large as the length of the semiconductor body 30 in the direction of the longitudinal axis of the semiconductor body 30 in the X direction. The two magnetic field sensors 34 and 38 are spaced apart from one another along the longitudinal axis of the semiconductor body 30 implemented in the X direction.

The longitudinal axis of the semiconductor body 30 is implemented along the Y direction and in the present case only the top surface of the semiconductor body 30 is visible. The encoding element 40 preferably has a size in the X direction that is only approximately half as large as the two parts 21 and 22 of the permanent magnet 20 or less.

Figure 14C:
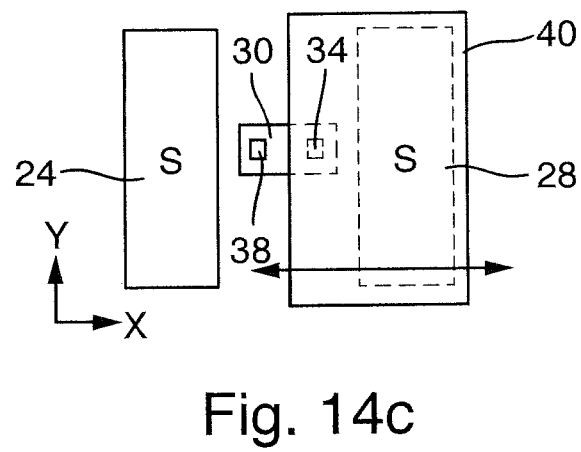
FIG. 14c is a top view of the embodiment according to the invention in a view in the X-Y plane.

In the illustration in FIG. 14c, a top view of the fourteenth embodiment according to the invention is shown in a view in the X-Y plane. Only the differences from FIG. 14a and FIG. 14b are explained below.

The encoding element 40 overlaps only the top of the south pole of the second part 22 and overlaps only one of the two magnetic field sensors 34 and 38, or in other words, the encoding element 40 influences the two magnetic field sensors 34 and 38 asymmetrically.

The south pole 24 of the first part 21 is designed identically to the south pole 24 of the second part 22 from a geometric standpoint. The south poles 24, located opposite one another, are designed to be parallel in the Y direction, which is to say that the gap is of equal width.

The semiconductor body 30 is located precisely centered or nearly centered between the two south poles 24 of the two parts 21 and 22 of the permanent magnet 20.

Figure 15A:
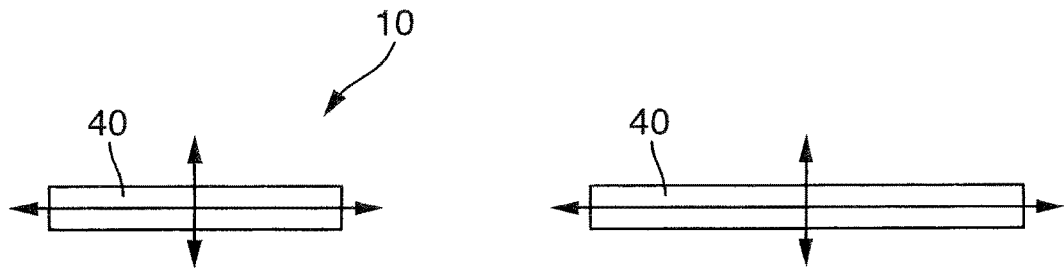
FIG. 15a is a top view of an embodiment according to the invention in a view in the Y-Z plane.
Figure 15A:
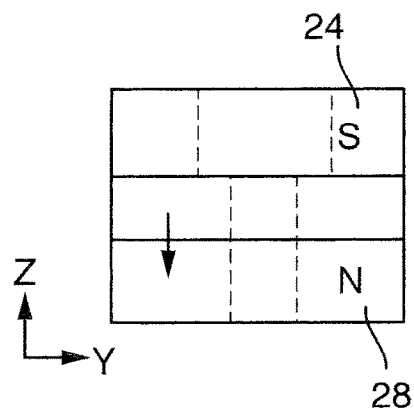

The illustration in FIG. 15a shows a top view of a fifteenth embodiment according to the invention of a distance measuring device 10 in a view in the Y-Z plane. The distance measuring device 10 includes a permanent magnet 20 with a direction of magnetization opposite the Z direction and south pole 24 resulting therefrom and a north pole 28 located above the south pole 24 in the Z direction and a semiconductor body 30, with a first monolithically integrated magnetic field sensor 34 and a second monolithically integrated magnetic field sensor 38 and a plate-shaped ferromagnetic encoding element 40.

The encoding element 40 is movable in all spatial directions, and preferably has a size in the Y direction that is comparable to or greater than the permanent magnet 20. The semiconductor body 30 has an integrated analysis circuit. In the present case, the first magnetic field sensor 34 is hidden by the second magnetic field sensor 38. The permanent magnet 20 has a vertical magnetization, i.e. in the Z direction.

Figure 15B:
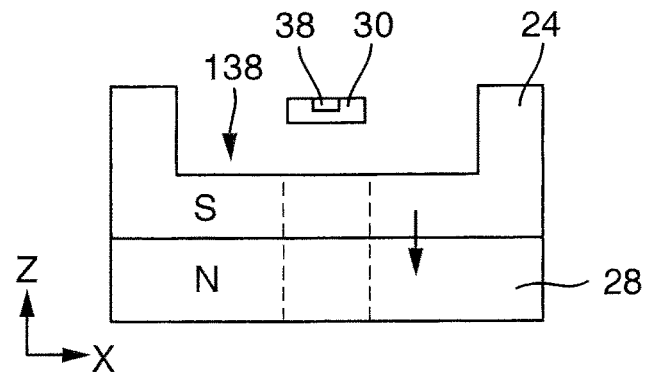
FIG. 15b is a top view of the embodiment according to the invention in a view in the X-Z plane.

In the illustration in FIG. 15b, a top view of the fifteenth embodiment according to the invention is shown in a view in the X-Z plane. Only the differences from FIG. 15a are explained below.

The round and cup-like permanent magnet 20 has an enclosing wall shank 124 of the south pole 24 in a Y-X plane, wherein the shank 124 as an enclosing wall is circular in design.

A floor region 130 as south pole 24 is formed between the enclosing wall; in other words, the polarity changes only along the Z direction.

The semiconductor body 30 has a longitudinal axis in the Y direction and is located inside the annular wall formed of the shank 124 and, when viewed in the Z direction, above the floor region 130, but within the height of the shank 124 formed in the Z direction.

The semiconductor body 30 is spaced apart from the floor region 130 in the Z direction. The encoding element 40 preferably has a size that is comparable to or greater than the permanent magnet 20 in the X direction as well.

A round hole 140 is formed in the center of the floor region 130.

Figure 15C:
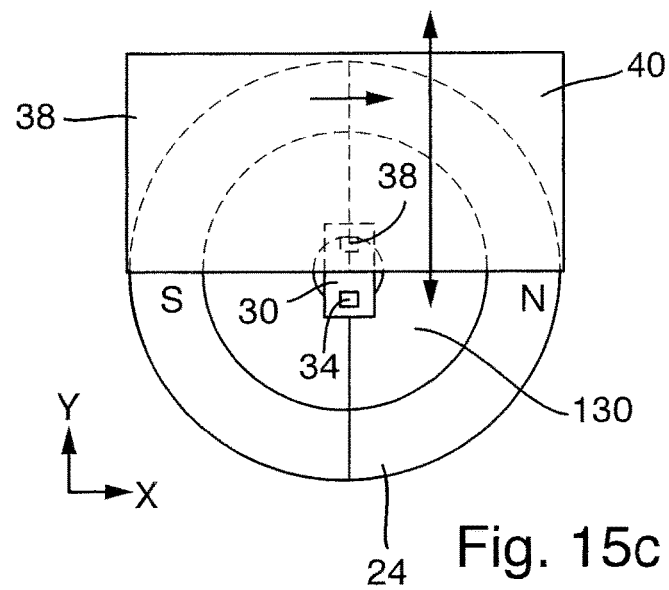
FIG. 15c is a top view of the embodiment according to the invention in a view in the X-Y plane.

In the illustration in FIG. 15c, a top view of the fifteenth embodiment according to the invention is shown in a view in the X-Y plane. Only the differences from FIG. 15a and FIG. 15b are explained below.

The encoding element 40 overlaps only approximately half of the permanent magnet 20, which is to say the two magnetic field sensors 24 and 28 are also covered unequally, and in other words the two magnetic field sensors are influenced asymmetrically by the encoding element 40.

The two magnetic field sensors 34 and 38 are located above the floor region 130. The semiconductor body 30 is located precisely centered or nearly centered between the enclosing wall, and is spaced apart from the floor region 130 in the Z direction. The two magnetic field sensors 34 and 38 are spaced apart from one another in the Y direction along the longitudinal axis of the semiconductor body 30.

The geometric center of the permanent magnet 20 is also located in the central floor region 130.

The first magnetic field sensor 34 is located in the region surrounded by the U-shaped shank 124 of the south pole 24, and the second magnetic field sensor 38 is located in the region surrounded by the U-shaped shank 128 of the north pole 28. As a result, the semiconductor body 30 is in the center of the U-shaped shank 124 of the south pole 24 and U-shaped shank 128 of the north pole 28, and in the Z direction is located in the center, preferably precisely in the center, over the geometric center.

Since the round hole 140 is formed in the central floor region 130, the geometric center of the permanent magnet 20 is also encompassed by the hole 140.

In other words, the normal formed in the Z direction at the location of the geometric center of the permanent magnet 20, starting from the center of the floor region 130, which is to say at the location where the hole 140 is formed, passes through the centroid at the surface of the semiconductor body 30 and thereby also bisects the imaginary distance line formed in the X direction between the two magnetic field sensors 34 and 38 at the surface of the semiconductor body 30.

The illustration in FIG. 16a shows a top view of a sixteenth embodiment according to the invention of a distance measuring device 10 in a view in the Y-Z plane. The distance measuring device 10 includes a permanent magnet 20 with a direction of magnetization opposite the Z direction and north pole 28 and south pole 24 resulting therefrom and a semiconductor body 30 with a first monolithically integrated magnetic field sensor 34 and a second monolithically integrated magnetic field sensor 38 and a plate-shaped ferromagnetic encoding element 40.

The encoding element 40 is movable in all spatial directions, and preferably has a size in the Y direction that is comparable to or greater than the permanent magnet 20. The semiconductor body 30 has an integrated analysis circuit. In the present case, the first magnetic field sensor 34 is hidden by the second magnetic field sensor 38.

The south pole 24 is located above the north pole 28 in the Z direction, which is to say that the permanent magnet 20 has a vertical magnetization.

In the illustration in FIG. 16b, a top view of the sixteenth embodiment according to the invention is shown in a view in the X-Z plane. Only the differences from FIG. 16a are explained below.

The quadrilateral and cup-like permanent magnet 20 has a shank 124 of the south pole 24 implemented as an enclosing wall. A floor region 130 implemented as south pole 24 is implemented within the enclosing wall; in other words, the polarity changes only along the Z axis.

The semiconductor body 30 has a longitudinal axis in the X direction and is located approximately in the center between the wall and, when viewed in the Z direction, above the floor region 130, but within the height of the shank 124 formed in the Z direction. The semiconductor body 30 is spaced apart from the floor region 130 in the Z direction. The encoding element 40 preferably has a size in the X direction that is only approximately half as large as the permanent magnet 20 or less. As a result, the encoding element 40 covers the two magnetic field sensors 24 and 28 unequally, and in other words the two magnetic field sensors are influenced asymmetrically by the encoding element 40.

A quadrilateral hole 140 is formed in the center of the floor region 130.

In the illustration in FIG. 16c, a top view of the sixteenth embodiment according to the invention is shown in a view in the X-Y plane. Only the differences from FIG. 16a and FIG. 16b are explained below. The encoding element 40 only covers half of the first magnetic field sensor 34 and the permanent magnet 20.

The two magnetic field sensors 34 and 38 are located above the floor region 130. The semiconductor body 30 is located precisely centered or nearly centered between the enclosing wall, and is spaced apart from the floor region 130 in the Z direction. The two magnetic field sensors 34 and 38 are spaced apart from one another in the X direction along the longitudinal axis of the semiconductor body 30.

The geometric center of the permanent magnet 20 is also located in the central floor region 130.

The semiconductor body 30 is in the middle of the wall-shaped shank 124 of the south pole 24, and in the Z direction is located in the center, preferably precisely in the center, over the geometric center.

In other words, the normal formed in the Z direction at the location of the geometric center of the permanent magnet 20, starting from the center of the floor region 130, passes through the centroid at the surface of the semiconductor body 30 and thereby also bisects the imaginary distance line formed in the X direction between the two magnetic field sensors 34 and 38 at the surface of the semiconductor body 30.

The hole 140 can be quadrilateral in design in the central floor region 130 and contains the centroid of the floor region 130.

In other words, the normal formed in the Z direction at the location of the geometric center of the permanent magnet 20, starting from the center of the floor region 130, which is to say at the location where the hole 140 is formed, passes through the centroid at the surface of the semiconductor body 30 and thereby also bisects the imaginary distance line formed in the X direction between the two magnetic field sensors 34 and 38 at the surface of the semiconductor body 30.

The illustration in FIG. 17a shows a top view of a seventeenth embodiment according to the invention of a distance measuring device 10 in a view in the Y-Z plane. The distance measuring device 10 includes a permanent magnet 20 with a direction of magnetization opposite the Z direction and south pole 24 and north pole 28 resulting therefrom and a semiconductor body 30 with a first monolithically integrated magnetic field sensor 34 and a second monolithically integrated magnetic field sensor 38 and a plate-shaped ferromagnetic encoding element 40.

The encoding element 40 is movable in all spatial directions, and preferably has approximately the same or a greater size in the Y direction than the permanent magnet 20. The semiconductor body 30 has an integrated analysis circuit. In the present case, the first magnetic field sensor 34 is spaced apart from the second magnetic field sensor 38 in the X direction, which is to say that the second magnetic field sensor 38 covers the first magnetic field sensor 34.

The permanent magnet 20 has a vertical magnetization formed in the Z direction, wherein the south pole 24 is located above the north pole 28.

In the illustration in FIG. 17b, a top view of the seventeenth embodiment according to the invention is shown in a view in the X-Z plane. Only the differences from FIG. 17a are explained below.

The permanent magnet 20, which is quadrilateral and only partially cup-like in design, has a U-shaped shank 124 of the south pole 24 formed in the X-Y direction.

A floor region 130 as south pole 24 is formed between the sides of the U-shaped shank 124 of the south pole 24; in other words, the polarity changes only along the Z direction. The magnetization is thus vertical in the Z direction. The wall formed by the shank 124 encloses the floor region 130 only on three sides, which is to say that the partially cup-like permanent magnet 20 is open when viewed in the direction of the Y axis, i.e., the enclosing wall implemented as the south pole 24 is absent along an X-Z plane.

The semiconductor body 30 has a longitudinal axis in the X direction and is located approximately in the center between the region formed by the U-shaped shank 124 and, when viewed in the Z direction, above the floor region 130, but within the height of the shank 124 formed in the Z direction. The semiconductor body 30 is spaced apart from the floor region 130 in the Z direction. The encoding element 40 preferably has a size in the X direction that is only approximately half as large as the permanent magnet 20 or less. As a result, the encoding element 40 overlaps the two magnetic field sensors 24 and 28 unequally, or in other words, the two magnetic field sensors are influenced asymmetrically by the encoding element 40.

A quadrilateral hole 140 is formed in the center of the floor region 130.

In the illustration in FIG. 17c, a top view of the seventeenth embodiment according to the invention is shown in a view in the X-Y plane. Only the differences from FIG. 17a and FIG. 17b are explained below. The encoding element 40 only partially covers the permanent magnet 20 and the semiconductor body 30.

The U-shaped shank 124 of the south pole 24 encloses the floor region 130 only on three sides.

The two magnetic field sensors 34 and 38 are spaced apart from one another in the X direction along the longitudinal axis of the semiconductor body 30 and are located above the floor region 130 of the south pole 24. The semiconductor body 30 is located eccentrically near the wall along the X direction. The semiconductor body 30 is spaced apart from the floor region 130 in the Z direction.

The geometric center of the permanent magnet 20 is also located in the central floor region 130.

Both magnetic field sensors 34 and 38 are located in the region of the U-shaped shank 124 of the south pole 24. The semiconductor body 30 is approximately in the middle of the U-shaped shank 124 of the south pole 24, and in the Z direction is located in the center, preferably precisely in the center, over the geometric center.

In other words, the normal formed in the Z direction at the location of the geometric center of the permanent magnet 20, starting from the center of the floor region 130, passes through the centroid at the surface of the semiconductor body 30 and thereby also bisects the imaginary distance line formed in the Y direction between the two magnetic field sensors 34 and 38 at the surface of the semiconductor body 30.

The hole 140 is quadrilateral in design in the central floor region 130 and contains the centroid of the floor region 130.

In other words, the normal formed in the Z direction at the location of the geometric center of the permanent magnet 20, starting from the center of the floor region 130, which is to say at the location where the hole 140 is formed, passes through the centroid at the surface of the semiconductor body 30 and thereby also bisects the imaginary distance line formed in the X direction between the two magnetic field sensors 34 and 38 at the surface of the semiconductor body 30.

The invention being thus described, it will be obvious that the same may be varied in many ways. Such variations are not to be regarded as a departure from the spirit and scope of the invention, and all such modifications as would be obvious to one skilled in the art are to be included within the scope of the following claim.

What is claimed is:

1. A distance measuring device comprising:
a first magnetic field sensor adapted to provide a first measurement signal as a function of a strength of a magnetic field;
at least one permanent magnet having a first magnetic pole with a first pole face and a second magnetic pole with a second pole face;
a semiconductor body with a monolithically integrated analysis circuit, the analysis circuit being in operative electrical connection with the first magnetic field sensor, the semiconductor body having a surface formed in an X-Y plane;
a second magnetic field sensor being of a same type as the first magnetic field sensor, the second magnetic field sensor providing a second measurement signal as a function of the strength of the magnetic field, the second magnetic field sensor being connectable with the monolithically integrated analysis circuit,
wherein the analysis circuit determines a difference signal for suppression of DC magnetic fields and provides an output signal as a result of the determination,
wherein a value of the output signal determined from the first magnetic field sensor and the second magnetic field sensor is a function of a distance of a ferromagnetic encoder element from the first and second magnetic field sensors,
wherein the first and second magnetic field sensors are frictionally attached to a surface of the semiconductor body and are arranged such that the first and second magnetic field sensors measure a same component of the magnetic field, and
wherein, in a first configuration, to measure a magnitude of a flux change for a first encoder element, the flux change acting with equal strength on the first and second magnetic field sensors, the semiconductor body is arranged between pole shanks of the magnet, the magnet is magnetized in an X or Y direction, the first magnetic field sensor being arranged in an area located between the pole shanks of the magnet, and the second magnetic field sensor being arranged in the area located between the pole shanks of the magnet, a connecting portion of the magnet extending between the pole shanks, and the semiconductor body being arranged above the connecting portion in a Z direction such that a single X-Y plane intersects the semiconductor body and the pole shanks, the first encoder element being the ferromagnetic encoder element, or wherein, in a second configuration, to measure a magnitude of a flux change for a second encoder element acting with different strengths on the first and second magnetic field sensors, the permanent magnet is magnetized in a Z direction and the first and second pole faces is formed in the X-Y plane and the first and second magnetic field sensors are each arranged opposite the first and second pole faces, respectively, the first and second pole faces having different polarities, the second encoder element being the ferromagnetic encoder element.

2. The distance measuring device according to claim 1, wherein, in the first configuration, the permanent magnet is U-shaped in design and wherein the pole shanks are four substantially straight and substantially parallel shanks.

3. The distance measuring device according to claim 1, wherein, in the first configuration or the second configuration, the permanent magnet has a recess in a central region, and wherein the recess is designed in the form of a hole.

4. The distance measuring device according to claim 3, wherein the central region includes a geometric center of the permanent magnet.

5. The distance measuring device according to claim 1, wherein, in the first configuration or the second configuration, the semiconductor body is located above a geometric center of the permanent magnet so that a normal formed at the location of the geometric center of the permanent magnet passes through the semiconductor body.

6. The distance measuring device according to claim 1, wherein, in the first configuration or the second configuration, the permanent magnet is composed of two single magnets arranged directly adjacent to one another.

7. The distance measuring device according to claim 1, wherein, in the first configuration, the connecting portion is formed between the pole shanks, and wherein a polarity of the permanent magnet switches along a center line in the connecting portion, or wherein the polarity in connecting portion of the permanent magnet remains the same.

8. The distance measuring device according to claim 1, wherein, in the first configuration, the pole shanks form an enclosing wall in the X-Y plane, and wherein a first half of the enclosing wall has a first magnetic polarity and a second half of the enclosing wall has a second magnetic polarity.

9. The distance measuring device according to claim 1, wherein, in the first configuration, surfaces of the two magnetic field sensors located in the X-Y plane have an equal or shorter distance from the connecting portion of the permanent magnet in the Z direction than do pole faces formed at ends of the pole shanks of the permanent magnet from the connecting portion.

10. The distance measuring device according to claim 1, wherein, in the second configuration, the two magnetic field sensors have a same distance from an immediately adjacent pole face of the first and second pole faces.

11. The distance measuring device according to claim 1, wherein, in the second configuration, the first and second magnetic field sensors are spaced apart in a Y direction, the first and second pole faces being formed along a Y direction perpendicular to the X direction and the Z direction.

12. The distance measuring device according to claim 1, wherein, in the first configuration, the first and second magnetic field sensors are arranged along the X direction, and are arranged between the pole shanks of the permanent magnet, at least two shanks of the pole shanks being spaced apart from one another in the X direction.

13. The distance measuring device according to claim 1, wherein, in the first configuration or the second configuration, the first or second magnetic field sensors are Hall sensors, and wherein the Hall sensors are monolithically integrated into the semiconductor body.

14. The distance measuring device according to claim 13, wherein the Hall sensors are Hall plates implemented in the X-Y plane.

15. The distance measuring device according to claim 1, wherein, in the first configuration, the connecting portion of the magnet extends between four shanks of the pole shanks at a first end of two shanks of the four shanks opposite a second end of two shanks of the four shanks, the second end of the four shanks being closer to the first magnetic field sensor or the second magnetic field sensor than the first end of the four shanks, or wherein in the second configuration, the connecting portion of the magnet connecting a first two shanks of the pole shanks having a first polarity along a first upper face, and wherein the connecting portion of the magnet connecting a second two shanks of the four shanks having a second polarity along a second upper face.

16. The distance measuring device according to claim 1, wherein, in the first configuration or the second configuration, the semiconductor body is surrounded on three sides by the permanent magnet.

17. The distance measuring device according to claim 1, wherein, in the first configuration, two out of four shanks of the pole shanks are disposed on a first side of the semiconductor body and another two of the four shanks are disposed on a second side of the semiconductor body, and wherein the four shanks each have a pole face at a second end opposite the connecting portion, the two shanks disposed on the first side of the semiconductor body having oppositely-polarized pole faces and the two shanks disposed on the second side of the semiconductor body having oppositely-polarized pole faces.

18. A distance measuring device comprising:
a first magnetic field sensor adapted to provide a first measurement signal as a function of a strength of a magnetic field;
at least one permanent magnet having a first magnetic pole with a first pole face and a second magnetic pole with a second pole face, the magnet being magnetized in the Z direction;
a semiconductor body with a monolithically integrated analysis circuit, the analysis circuit being in operative electrical connection with the first magnetic field sensor, the semiconductor body having a surface formed in an X-Y plane;
a second magnetic field sensor being of a same type as the first magnetic field sensor, the second magnetic field sensor providing a second measurement signal as a function of the strength of the magnetic field, the second magnetic field sensor being connectable with the monolithically integrated analysis circuit, wherein the analysis circuit determines a difference signal for suppression of DC magnetic fields and provides an output signal as a result of the determination, wherein a value of the output signal determined from the first magnetic field sensor and the second magnetic field sensor is a function of a distance of a ferromagnetic encoder element from the first and second magnetic field sensors, wherein the first and second magnetic field sensors are frictionally attached to a surface of the semiconductor body and are arranged such that the first and second magnetic field sensors measure a same component of the magnetic field, wherein the first and second magnetic field sensors measure a magnitude of a flux change from the ferromagnetic encoder element acting with different strengths on the first and second magnetic field sensors, and wherein the first pole face and the second pole face of the magnet are formed in the X-Y plane, the first pole face and the second pole face each having a single polarity, and the first and second magnetic field sensors are both arranged opposite the first pole face and the second pole face, respectively, the single polarities of the first pole face and the second pole face being different.

19. A distance measuring device comprising:

a first magnetic field sensor adapted to provide a first measurement signal as a function of a strength of a magnetic field;

at least one permanent magnet having a first magnetic pole with a first pole face and a second magnetic pole with a second pole face, the permanent magnet being magnetized in an X direction;

a semiconductor body with a monolithically integrated analysis circuit, the analysis circuit being in operative electrical connection with the first magnetic field sensor, the semiconductor body having a surface formed in an X-Y plane, the semiconductor body being arranged between pole shanks of the permanent magnet such that a single X-Y plane intersects the semiconductor body and the pole shanks, each of the pole shanks being magnetized in a Z direction;

a second magnetic field sensor being of a same type as the first magnetic field sensor, the second magnetic field sensor providing a second measurement signal as a function of the strength of the magnetic field, the second magnetic field sensor being connectable with the monolithically integrated analysis circuit, the first magnetic field sensor and the second magnetic field sensor being arranged in an area located between the pole shanks of the magnet, wherein the analysis circuit determines a difference signal for suppression of DC magnetic fields and provides an output signal as a result of the determination, wherein a value of the output signal determined from the first magnetic field sensor and the second magnetic field sensor is a function of a distance of a ferromagnetic encoder element from the first and second magnetic field sensors, wherein the first and second magnetic field sensors are frictionally attached to a surface of the semiconductor body and are arranged such that the first and second magnetic field sensors measure a same component of the magnetic field, and wherein the first and second magnetic field sensors measure a magnitude of a flux change from the ferromagnetic encoder element at the first and second magnetic field sensors, the flux change acting with equal strength on the first and second magnetic field sensors.

20. The distance measuring device of claim 19, further comprising:

a connecting portion of the magnet extending between four shanks of the pole shanks at a first end of the four shanks opposite a second end of the four shanks, the second end of the four shanks being closer to the first magnetic field sensor or the second magnetic field sensor than the first end of the four shanks, and the semiconductor body being arranged above the connecting portion in a Z direction.

* * * * *